US010068768B2

(12) United States Patent
Oh et al.

(10) Patent No.: US 10,068,768 B2
(45) Date of Patent: Sep. 4, 2018

(54) SEMICONDUCTOR DEVICE INCLUDING LINE PATTERNS

(71) Applicant: SAMSUNG ELECTRONICS CO., LTD., Suwon-si, Gyeonggi-do (KR)

(72) Inventors: In-wook Oh, Suwon-si (KR); Jong-hyun Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/009,921

(22) Filed: Jan. 29, 2016

(65) Prior Publication Data

US 2016/0307844 A1 Oct. 20, 2016

(30) Foreign Application Priority Data

Apr. 16, 2015 (KR) ........................ 10-2015-0053774

(51) Int. Cl.

| | |
|---|---|
| ***H01L 23/48*** | (2006.01) |
| ***H01L 23/52*** | (2006.01) |
| ***H01L 29/40*** | (2006.01) |
| ***H01L 21/033*** | (2006.01) |
| ***H01L 23/00*** | (2006.01) |
| ***H01L 23/528*** | (2006.01) |
| ***H01L 21/311*** | (2006.01) |
| ***H01L 21/768*** | (2006.01) |

(52) U.S. Cl.

CPC ...... *H01L 21/0338* (2013.01); *H01L 21/0337* (2013.01); *H01L 21/31144* (2013.01); *H01L 21/76816* (2013.01); *H01L 23/528* (2013.01); *H01L 24/06* (2013.01)

(58) Field of Classification Search

CPC ........... H01L 21/0338; H01L 21/76816; H01L 21/0337; H01L 21/31144; H01L 23/528; H01L 24/06

See application file for complete search history.

(56) References Cited

U.S. PATENT DOCUMENTS

| | | | | |
|---|---|---|---|---|
| 8,227,354 | B2 | 7/2012 | Kim et al. | |
| 8,242,022 | B2 | 8/2012 | Kim | |
| 8,288,083 | B2 | 10/2012 | Zhang et al. | |
| 8,486,610 | B2 | 7/2013 | Abatchev et al. | |
| 8,593,001 | B2 | 11/2013 | Hopkins | |
| 8,623,771 | B2 | 1/2014 | Yi | |
| 8,629,052 | B2 | 1/2014 | Park et al. | |
| 2008/0206686 | A1 * | 8/2008 | Lee ..................... | H01L 21/0337 430/323 |
| 2008/0227258 | A1 * | 9/2008 | Park .................... | H01L 21/0334 438/301 |

(Continued)

*Primary Examiner* — Thanh Y Tran

(74) *Attorney, Agent, or Firm* — Lee & Morse, P.C.

(57) ABSTRACT

Provided is a semiconductor device. The device includes a plurality of line patterns, which extend in a first direction and are arranged a first space apart from one another in a second direction perpendicular to the first direction. The line patterns include a line pattern set including two sub-line patterns that are arranged the first space apart from each other in the second direction and have a first width of a minimum feature size (1F) in the second direction, and a wide-width line pattern that is arranged the first space apart from one side of the line pattern set in the second direction and has a second width larger than the first width in the second direction.

18 Claims, 30 Drawing Sheets

(56) References Cited

U.S. PATENT DOCUMENTS

| | | | | |
|---|---|---|---|---|
| 2010/0178773 | A1 | 7/2010 | Oh et al. | |
| 2010/0244269 | A1* | 9/2010 | Kim | H01L 21/0337 257/773 |
| 2013/0065397 | A1* | 3/2013 | Chen | H01L 21/0337 438/703 |
| 2014/0213035 | A1 | 7/2014 | Park et al. | |
| 2014/0264516 | A1* | 9/2014 | Seo | H01L 43/12 257/295 |
| 2014/0273441 | A1 | 9/2014 | Kim et al. | |
| 2014/0295654 | A1 | 10/2014 | Hsieh et al. | |
| 2015/0099343 | A1* | 4/2015 | Kim | H01L 29/0649 438/421 |
| 2016/0181101 | A1* | 6/2016 | Yun | H01L 27/11524 257/522 |

* cited by examiner

SEMICONDUCTOR DEVICE INCLUDING LINE PATTERNS

CROSS-REFERENCE TO RELATED APPLICATION

This application claims the benefit of Korean Patent Application No. 10-2015-0053774, filed on Apr. 16, 2015, in the Korean Intellectual Property Office, the disclosure of which is incorporated herein in its entirety by reference.

BACKGROUND

Embodiments relate to a semiconductor device, and more particularly, to a semiconductor device including line patterns.

It may be necessary to downscale patterns to highly integrate semiconductor devices, namely, integrated circuit (IC) semiconductor devices. The size of unit devices must be reduced to integrate a relatively large number of unit devices in a small area. With a sharp reduction in the design rules of semiconductor devices, patterns (e.g., line patterns) required to embody the semiconductor devices need to be formed to a smaller size than a resolution limit of a photolithography process.

SUMMARY

Embodiments provide a semiconductor device including line patterns having a smaller size than the resolution limit of a photolithography process.

According to an aspect of embodiments, a semiconductor device may include a plurality of line patterns that extend in a first direction and are arranged apart from one another by a first space in a second direction perpendicular to the first direction. The line patterns may include a line pattern set including two sub-line patterns that are arranged apart from each other by the first space in the second direction and have a first width of a minimum feature size (1F) in the second direction, and a wide-width line pattern that is arranged apart from one side of the line pattern set by the first space in the second direction and has a second width greater than the first width in the second direction.

The first space between the line patterns may be determined by the minimum feature size. The first space between the line patterns may be greater than the minimum feature size and less than double (2F) the minimum feature size.

Wide-width line patterns may be arranged apart from two sides of the line pattern set by the first space in the second direction. The line patterns may be conductive line patterns.

Contact pads may be arranged on one-side end portions of the line pattern set and the wide-width line pattern in the first direction.

Auxiliary patterns may be arranged apart from the line pattern set and the wide-width line pattern wide-width by the first space in the first direction and the second direction.

According to another aspect of embodiments, a semiconductor device may include a first line pattern that extends in a first direction and has a first width of a minimum feature size in a second direction perpendicular to the first direction, a second line pattern that extends parallel to the first line pattern in the first direction, the second line pattern arranged apart from the first line pattern by the first space in the second direction and having a second width greater than the first width, a third line pattern set extending parallel to the second line pattern in the first direction, the third line pattern set arranged apart from the second line by the first space in the second direction, the third line pattern set including two sub-line patterns having the first width in the second direction and arranged apart from each other by the first space, a fourth line pattern extending in the first direction parallel to the third line pattern set, the fourth line pattern arranged apart from one side of the third line pattern set by the first space in the second direction and having the second width greater than the first width, and a fifth line pattern extending parallel to the fourth line pattern in the first direction, the fifth line pattern arranged apart from the fourth line pattern by the first space in the second direction, the fifth line pattern having the first width in the second direction.

The first space may be determined by the minimum feature size. The first space may be greater than the minimum feature size and less than double the minimum feature size.

The third line pattern set may include a first sub-line pattern arranged apart from the second line pattern and a second sub-line pattern arranged apart from the fourth line pattern.

The first line pattern, the second line pattern, the third line pattern set, the fourth line pattern, and the fifth line pattern may be conductive line patterns.

Contact pads may be arranged in respective one-side end portions of the first line pattern, the second line pattern, the third line pattern set, the fourth line pattern, and the fifth line pattern in the first direction.

The first line pattern, the second line pattern, the third line pattern set, the fourth line pattern, and the fifth line pattern may constitute one line pattern group. A plurality of line pattern groups may be arranged apart from one another by the first space in the second direction.

According to yet another aspect of embodiments, a semiconductor device may include an interlayer insulating layer that is formed on a substrate, a plurality of trenches that is formed in the interlayer insulating layer and arranged apart from one another by a first space, and a plurality of line patterns that are buried in the trenches. The line patterns may include a line pattern set including two sub-line patterns having a first width of a minimum feature size, and a first wide-width line pattern arranged on one side of the line pattern set and having a second width greater than the first width.

The trenches may have the first width and the second width, the two sub-line patterns of the line pattern set may be buried in trenches having the first width, and the first wide-width line pattern may be buried in a trench having the second width.

The first space may be determined by the minimum feature size and be greater than the minimum feature size and less than double the minimum feature size.

The line pattern set and the first wide-width line pattern may be conductive line patterns, and contact pads may be arranged in the line pattern set and the first wide-width line pattern.

The substrate may include a high-density region and a low-density region, and the line patterns may be formed in the high-density region. A second wide-width line pattern having a width greater than the sub-line patterns and the first wide-width line pattern may be formed in the low-density region.

BRIEF DESCRIPTION OF THE DRAWINGS

Example embodiments will be more clearly understood from the following detailed description taken in conjunction with the accompanying drawings, in which.

DETAILED DESCRIPTION OF EXAMPLE EMBODIMENTS

Figure 1:
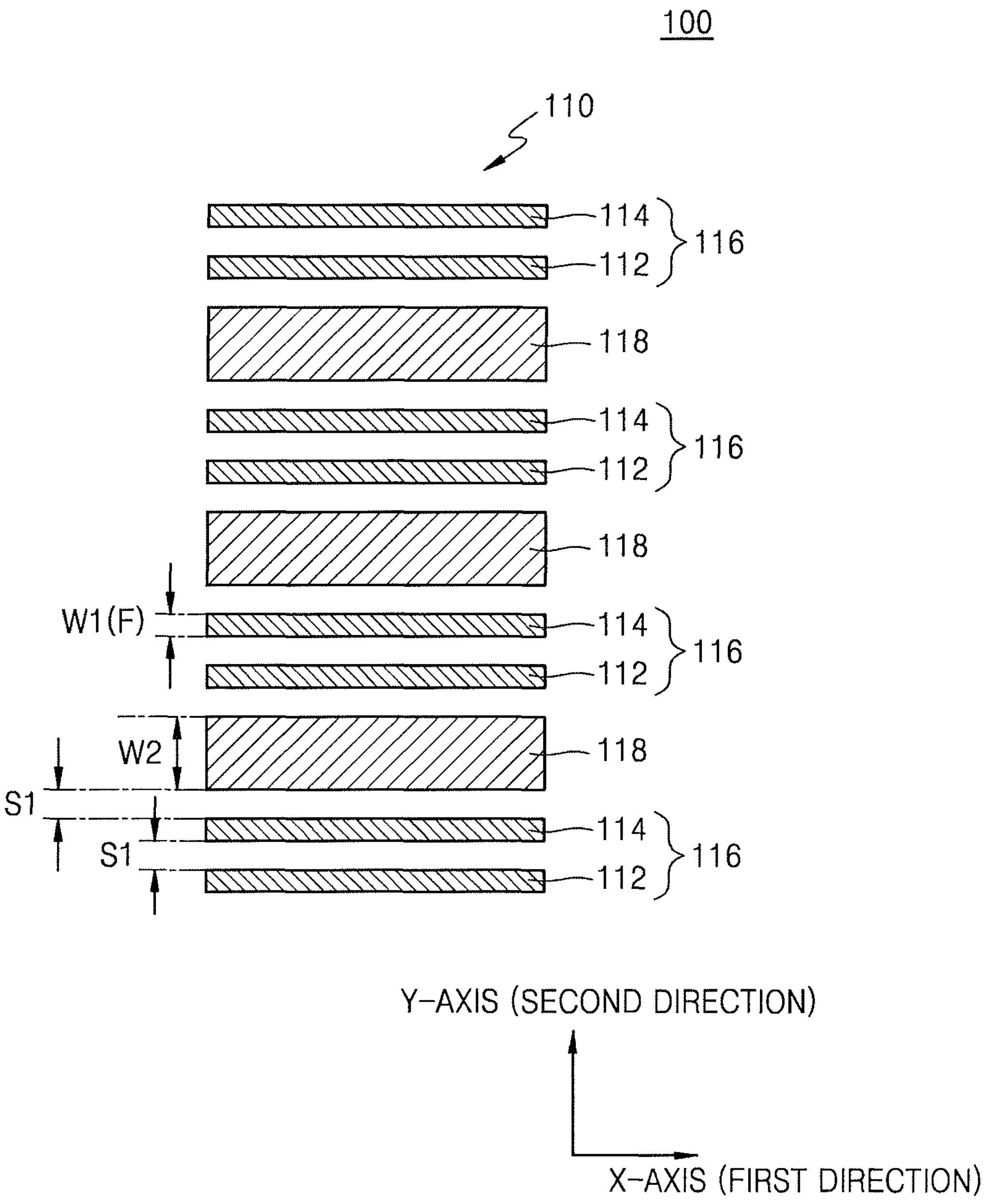
FIG. 1 is a partial layout diagram of a semiconductor device including line patterns, which are formed to a smaller size than a resolution limit of a photolithography process, according to an example embodiment.

Embodiments will now be described more fully hereinafter with reference to the accompanying drawings, in which example embodiments are shown. The example embodiments may, however, be embodied in different forms and should not be construed as limited to those set forth herein. Rather, these embodiments are provided so that this disclosure is thorough and complete and fully conveys the scope of the embodiments to one of skill in the art. In the drawings, the thicknesses of layers and regions may be exaggerated for clarity.

It will be understood that when an element (e.g., a layer, region, or wafer (substrate)) is referred to as being "on", "connected to" or "coupled to" another element, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Terms that describe spatial relationships, such as "below", "lower", "above", "upper" and the like, may be used herein for ease of description to describe one element or feature's relationship to another element(s) or feature(s) as illustrated in the figures. It will be understood that such terms are intended to encompass different orientations of the device in use or operation in addition to the orientation(s) depicted in the figures. For example, if the device in the figures is turned over, elements described as "below" or "beneath" other elements or features would then be oriented "above" the other elements or features. Thus, the term "below" can encompass both an orientation of above and below. The orientation of the device may be changed in other ways (e.g., rotated 90 degrees or some other angle) and spatial relationships described herein should be interpreted within the context of the changed orientation.

The terminology used herein is for the purpose of describing particular embodiments only and is not intended to be limiting. As used herein, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. One or more of the embodiments may be combined.

Herein, a semiconductor device including line patterns according to example embodiments may be, for example, a highly integrated circuit semiconductor memory device (e.g., dynamic random access memory (DRAM), static random access memory (SRAM), or a flash memory device), a processor (e.g., a central processing unit (CPU), a digital signal processor (DSP), or a combination of a CPU and a DSP), an application specific integrated circuit (ASIC), a micro-electro-mechanical systems (MEMS) device, an optoelectronic device, or a display device, but the semiconductor device is not limited to the above-described examples.

FIG. 1 is a partial layout diagram of a semiconductor device 100 including line patterns, which are formed to a smaller size than a resolution limit of a photolithography process, according to an example embodiment.

Specifically, the semiconductor device 100 may include a plurality of line patterns 110, which may extend in a first direction (X-axis) and be arranged apart from one another by a first space S1 in a second direction (Y-axis) perpendicular to the first direction. The line patterns 110 may be fine patterns having a size less than the resolution limit of a photolithography process. The line patterns 110 may be conductive line patterns, for example, metal line patterns. The metal line patterns may be formed of aluminum (Al), tungsten (W), titanium (Ti), titanium nitride (TiN), chromium (Cr), cobalt (Co), or copper (Cu). The line patterns 110 may have widths W1 and W2 of about several tens of nm.

The line patterns 110 may include a line pattern set 116 including two sub-line patterns 112 and 114, which are arranged apart from each other by the first space S1 in the second direction and have a first width W1 in the second direction. The first width W1 of the sub-line patterns 112 and 114 constituting the line pattern set 116 may be a minimum feature size 1F of the semiconductor device 100. The minimum feature size 1F may refer to a minimum linewidth of a semiconductor process in consideration of semiconductor design rules due to the development of semiconductor design technology.

The line patterns 110 may include wide-width line patterns 118, which may be arranged apart from one another by the first space S1 in the second direction and have a second width W2 greater than the first width W1 in the second direction. The wide-width line patterns 118 may be arranged on two sides of the line pattern set 116 and arranged apart from each other by the first space S1 in the second direction.

The first space S1 between the line patterns 110, specifically, between the sub-line patterns 112 and 114 and between the wide-width line patterns 118 and the sub-line patterns 112 and 114 may be greater than the minimum feature size 1F and less than double (2F) of the minimum feature size 1F. The first space S1 between the line patterns 110 may be determined by the minimum feature size 1F.

Since the above-described semiconductor device 100 includes the line patterns 110 (i.e., the sub-line patterns 112 and 114 and the wide-width line patterns 118) having different thicknesses, device design flexibility may be improved.

Figure 2:
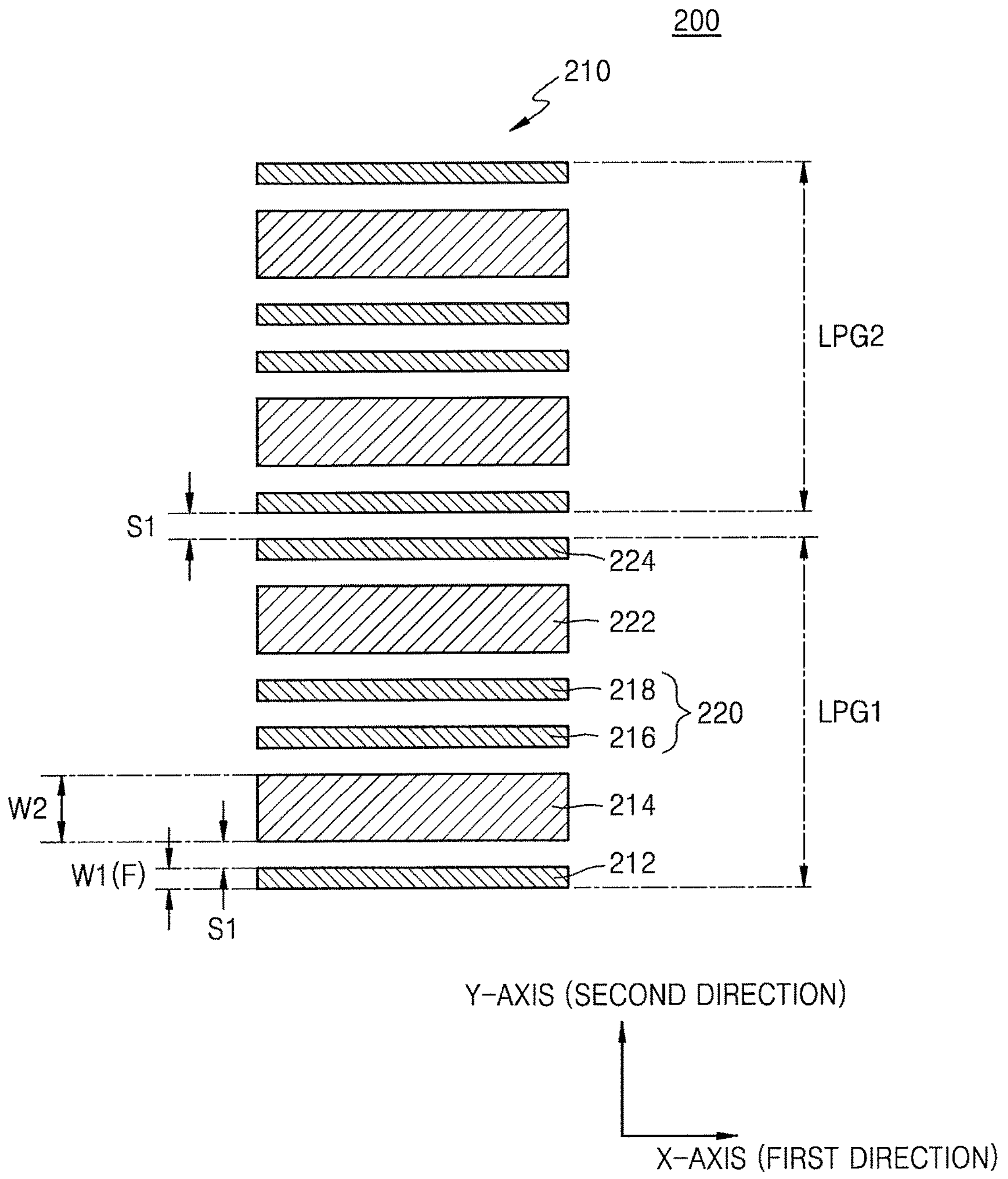
FIG. 2 is a partial layout diagram of a semiconductor device including line patterns, which are formed to a smaller size than the resolution limit of a photolithography process, according to an example embodiment.

FIG. 2 is a partial layout diagram of a semiconductor device 200 including line patterns 210, which are formed to a size less than the resolution limit of a photolithography process, according to an example embodiment.

Specifically, the semiconductor device 200 of FIG. 2 differs from the semiconductor device 100 of FIG. 1 in that the line patterns 210 of FIG. 2 are arranged in a different manner from the line patterns 110 of FIG. 1 and described by using different terms from the line patterns 110 of FIG. 1. The line patterns 210 may be fine patterns having a smaller size than the resolution limit of a photolithography process. The line patterns 210 may be conductive line patterns, for example, metal line patterns.

The line patterns 210 may include a first line pattern 212, a second line pattern 214, a third line pattern set 220 including two sub-line patterns 216 and 218, a fourth line pattern 222, and a fifth line pattern 224. As described above, the first line pattern 212, the second line pattern 214, the third line pattern set 220, the fourth line pattern 222, and the fifth line pattern 224 may be conductive line patterns. Each of widths W1 and W2 of the line patterns 210 may be several tens of nm.

The first line pattern 212 may extend in a first direction (X-axis), and have a first width W1 in a second direction (Y-axis) perpendicular to the first direction. The first width W1 of the first line pattern 212 may be a minimum feature size 1F of the semiconductor device 200. The second line pattern 214 may extend in the first direction parallel to the first line pattern 212, and be arranged apart from the first line pattern 212 by a first space S1 in the second direction and have a second width W2 greater than the first width W1. The second line pattern 214 may be a wide-width line pattern having a larger width than the first line pattern 212.

The first space S1 may be determined by the minimum feature size 1F. The first space S1 may be greater than the minimum feature size 1F and less than double (2F) the minimum feature size 1F.

The third line pattern set 220 may extend in the first direction parallel to the second line pattern 214, and be arranged apart from the second line pattern 214 by the first space S1 in the second direction. The third line pattern set 220 may include two sub-line patterns 216 and 218, which may have the first width W1 in the second direction and be arranged apart from each other by the first space S1. Arbitrary patterns may not be arranged between the sub-line patterns 216 and 218.

The fourth line pattern 222 may extend in the first direction parallel to the third line pattern set 220. The fourth line pattern 222 may be arranged apart from one side of the third line pattern set 220 by the first space S1 in the second direction and have the second width W2 greater than the first width W1. The fourth line pattern 222 may be a wide-width line pattern having a larger width than the first line pattern 212 and the third line pattern set 220.

The fifth line pattern 224 may extend in a first direction parallel to the fourth line pattern 222 and be arranged apart from the fourth line pattern 222 by a first spacer S1 in a second direction.

The first line pattern 212, the second line pattern 214, the third line pattern set 220, the fourth line pattern 222, and the fifth line pattern 224, which may constitute the above-described line patterns 210, may constitute one line pattern group LPG1. Another line pattern group LPG2 may be arranged apart from the line pattern group LPG1 by the first space S1 in the second direction. A plurality of line pattern groups, for example, the line pattern groups LPG1 and LPG2, may be arranged in the second direction.

Since the above-described semiconductor device 200 includes line patterns 210 having different thicknesses, namely, the first line pattern 212, the second line pattern 214, the third line pattern set 220, the fourth line pattern 222, and the fifth line pattern 224, device design flexibility of the semiconductor device 200 may be improved.

Hereinafter, a method of forming the line patterns 110 and 210 of the semiconductor devices 100 and 200 shown in FIGS. 1 and 2 will be conceptually described with reference to FIGS. 3A to 3E and 4.

Figure 3A:
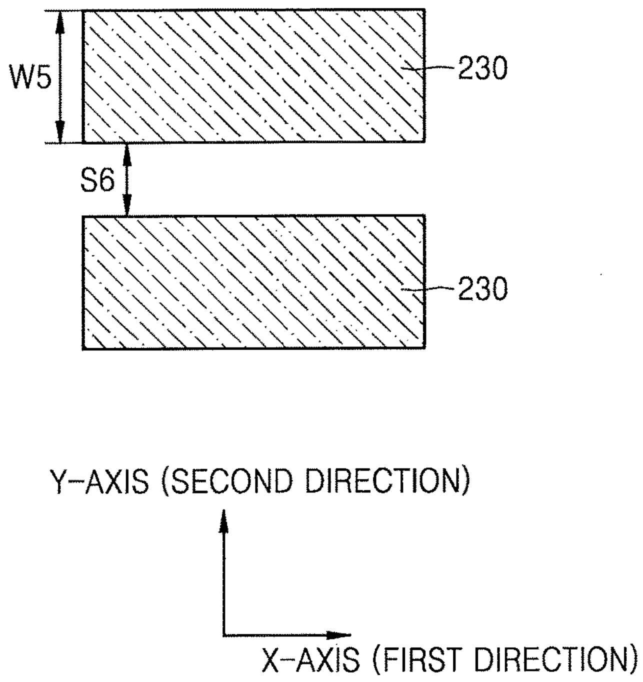
FIGS. 3A to 3E are conceptual plan views of stages in a method of forming line patterns to a smaller size than the resolution limit of a photolithography process, according to an example embodiment.
Figure 3B:
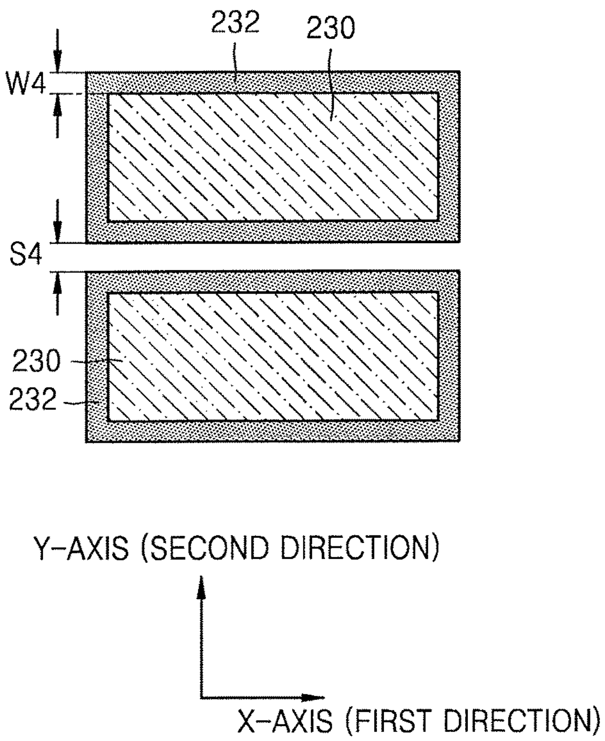
Figure 3C:
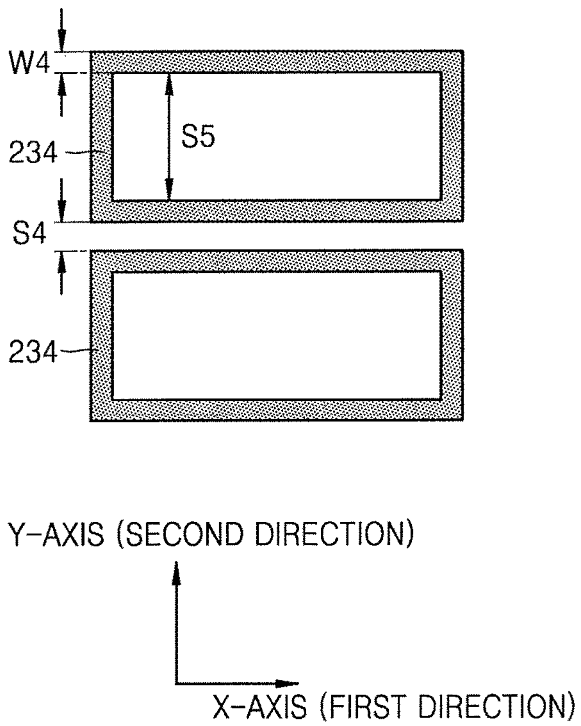
Figure 3D:
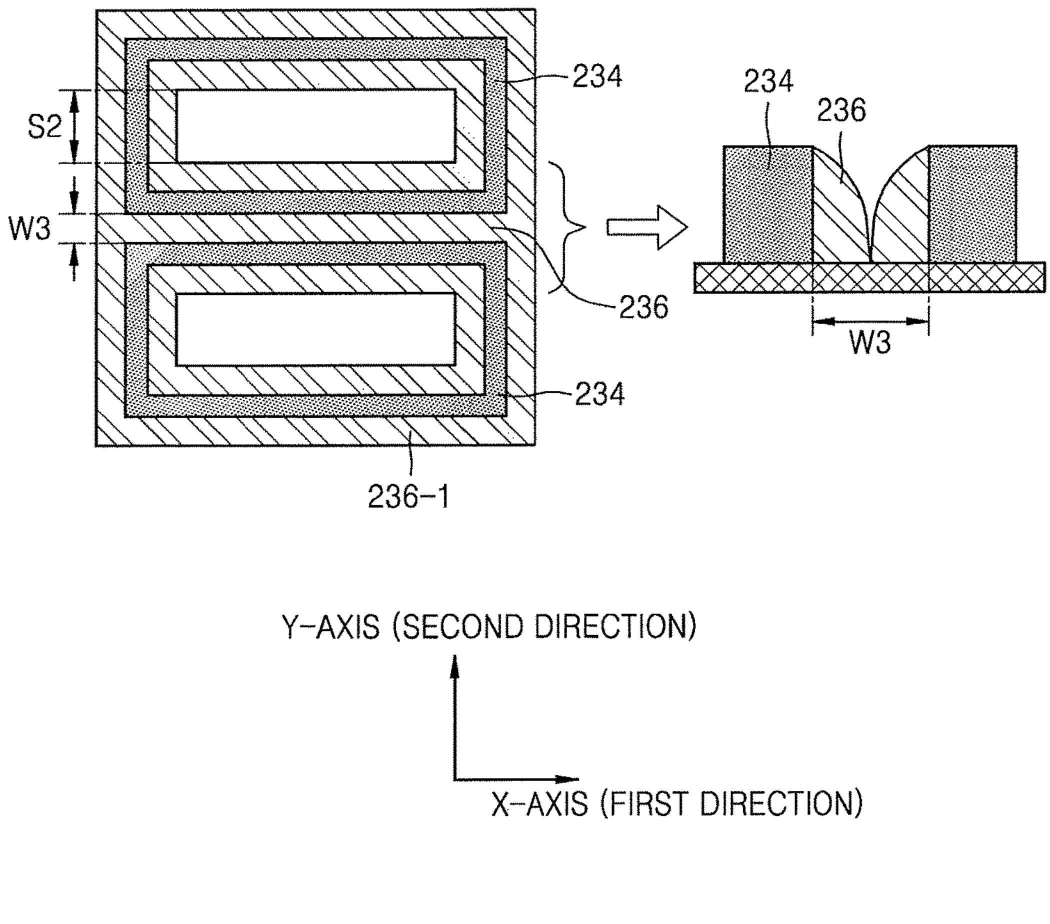
Figure 3E:
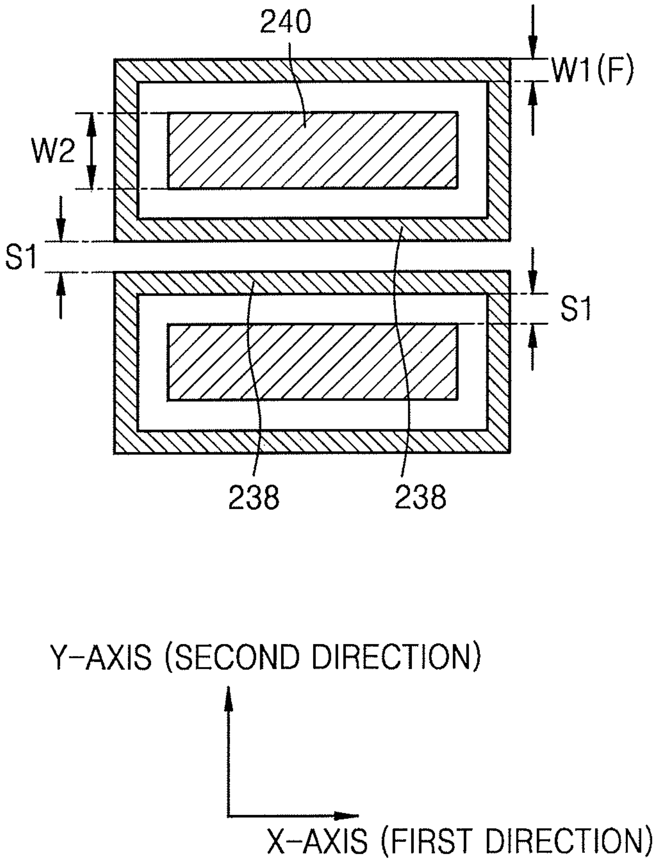
Figure 4:
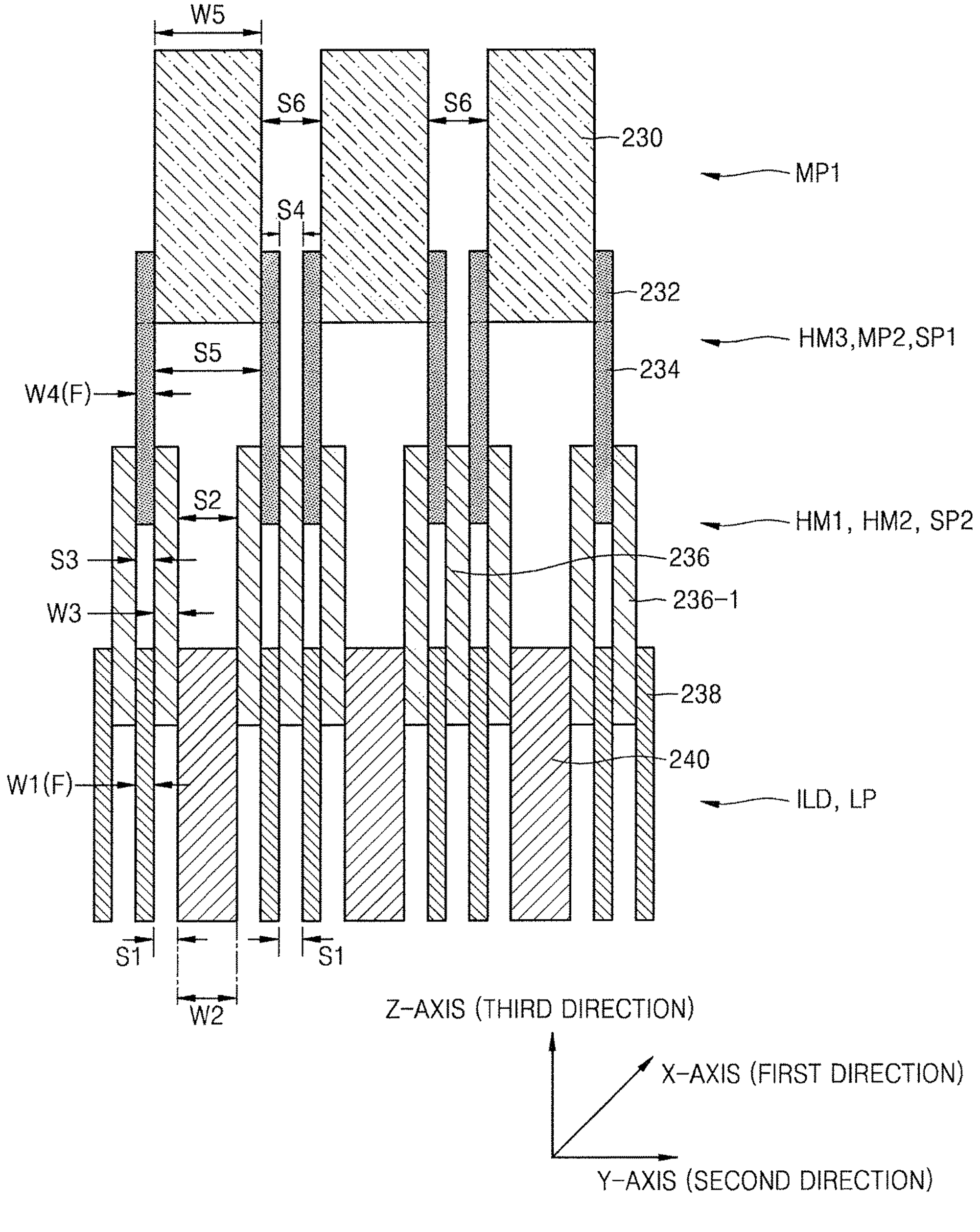
FIG. 4 is a conceptual cross-sectional view for hierarchically or vertically explaining a method of forming the line patterns of FIG. 3.

FIGS. 3A to 3E are conceptual plan views of a method of forming line patterns to a smaller size than the resolution limit of a photolithography process, according to an example embodiment, and FIG. 4 is a conceptual cross-sectional view for hierarchically or vertically explaining a method of forming the line patterns of FIG. 3.

Specifically, FIGS. 3A to 3E and 4 are conceptual diagrams illustrating a method of forming line patterns 238 and 240 having different thicknesses by using a self-aligned quadruple patterning (SAQP) process and a damascene process.

As shown in FIGS. 3A and 4, the method of forming the line patterns may include an initial process of forming a plurality of first mandrel patterns (230, MP1) by using a photolithography process. The first mandrel patterns 230 may have a width W5. The first mandrel patterns 230 may be arranged apart from one another by a space S6. The first mandrel patterns 230 may have the width W5 and the space S6 due to the resolution limit of a photolithography process. Also, each of the width W5 and the space S6 of the first mandrel patterns 230 may have a minimum feature size 1F of a semiconductor device that will be described later.

Thereafter, as shown in FIG. 4, first spacer patterns (232, SP1) and second mandrel patterns (234, MP2) may be formed under the first mandrel patterns 230 and self-aligned with two sidewalls of the first mandrel patterns 230. As shown in FIG. 4, the second mandrel patterns 234 may correspond to third hard mask patterns HM3.

As shown in FIG. 3B, the first spacer patterns 232 may be formed on sidewalls of the first mandrel patterns 230. As shown in FIG. 3C, the second mandrel patterns 234 may be formed after the first mandrel patterns 230 are removed. As shown in FIG. 4, the second mandrel patterns 234 may be formed in positions that are vertically located under the first spacer patterns 232. As shown in FIG. 3C, positions in which the second mandrel patterns 234 are formed may be planarly the same as positions in which the first spacer patterns 232 are formed.

The first spacer patterns 232 and the second mandrel patterns 234 may have a width W4. The second mandrel patterns 234 may be arranged apart from one another by a space S4. An inner space S5 between the second mandrel patterns 234 may correspond to lower portions of the first mandrel patterns 230. The inner space S5 between the second mandrel patterns 234 may correspond to the width W5 of the first mandrel patterns 230.

Subsequently, as shown in FIG. 4, second spacer patterns 236, 236-1, and SP2 may be formed under the second mandrel patterns 234 and self-aligned with two sidewalls of the second mandrel patterns 234. As shown in FIG. 3D, the second spacer patterns 236 and 236-1 may be formed on the two sidewalls of the second mandrel patterns 234. As shown in FIG. 4, the second spacer patterns 236 and 236-1 may correspond to a first hard mask pattern HM1 and a second hard mask pattern HM2.

As shown in FIG. 3D, the second spacer patterns 236 and 236-1 may be formed between the second mandrel patterns 234. As shown in FIG. 4, the second spacer patterns 236 and 236-1 may be formed vertically under spaces between the first mandrel patterns 230 and vertically under spaces between the second mandrel patterns 234.

As shown in FIG. 3D, the second spacer patterns 236 and 236-1 may be planarly formed inside and outside the first mandrel patterns 230 and inside and outside the second mandrel patterns 234. As shown in FIG. 4, the second spacer patterns 236 and 236-1 may be vertically arranged under the first mandrel patterns 230 and the second mandrel patterns 234 and formed inside and outside the second mandrel patterns 234.

The second spacer patterns 236 and 236-1 may have a width W3. The second spacer patterns 236 and 236-1 arranged under the first mandrel patterns 230 may be arranged apart from one another by a space S2, and the second spacer patterns 236 and 236-1 arranged under the second mandrel patterns 234 may be arranged apart from one another by a space S3.

Subsequently, as shown in FIG. 4, line patterns (LPs) 238 and 240 may be formed under the second spacer patterns 236 and 236-1 and self-aligned with two sidewalls of the second spacer patterns 236 and 236-1. The line patterns 238 formed between the second spacer patterns 236-1 under the second mandrel patterns 234 may have a width WL corresponding to the minimum feature size 1F. The line patterns 240 arranged under the first mandrel patterns 230 may have a width W2 greater than the width W1. The line patterns 238 may be arranged apart from one another by a space S1.

The line patterns 238 may correspond to the line pattern set 116 (112, 114) of FIG. 1 and the first line pattern 212 and the third line pattern set 220 (216, 218) of FIG. 2. The line patterns 240 may correspond to the wide-width line patterns 118 of FIG. 1 and the fourth line pattern 222 of FIG. 2. The line patterns 238 and 240 may be formed at a level corresponding to an interlayer insulating layer (ILD).

Hereinafter, a semiconductor device including line patterns described with reference to FIGS. 1 to 4 will be described with reference to FIG. 5.

Figure 5:
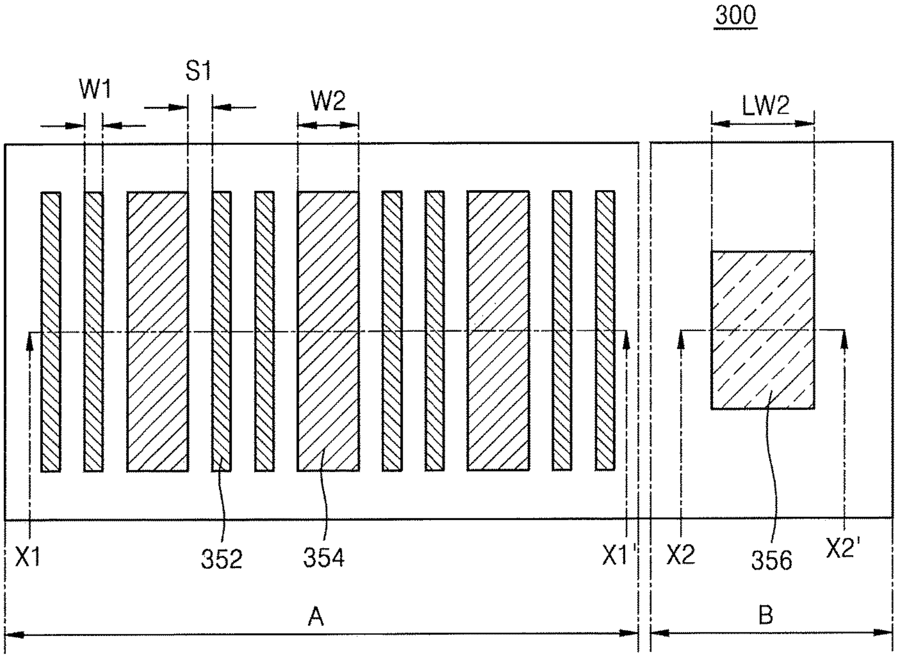
FIG. 5 is a partial layout diagram of a semiconductor device including line patterns according to an example embodiment.

FIG. 5 is a partial layout diagram of a semiconductor device 300 including line patterns according to an example embodiment.

Specifically, the semiconductor device 300 may include a high-density region A and a low-density region B. The high-density region A may be a cell array region in which unit memory devices are formed. The high-density region A may be a chip region in which a power pad or ground pad is formed. The low-density region B may be a peripheral region or core region in which peripheral circuits for driving the unit memory devices formed in the high-density region A are formed. Alternatively, the low-density region B may be a portion of the cell array region, in which a pattern having a relatively large width is formed. Also, the high-density region A may be a dummy region, which is required not to drive the semiconductor device 300 but to design or manufacture the semiconductor device 300.

The high-density region A may include a plurality of line patterns (e.g., line patterns 352 and 354), which may have a first width W1 and a second width W2 and extend parallel to one another. The second width W2 may be larger than the first width W1. The line patterns 352 and 354 may be arranged apart from one another by a first space S1 having a relatively small dimension. In the high-density region A, the first width W1 and the first space S1 may be arbitrarily designed according to the kind of a unit device to be formed and desired characteristics. The first width W1 may be a minimum feature size 1F of the semiconductor device 300. Each of the first width W1 and the first space S1 may be several tens of nm.

A second wide-width line pattern 356 having a large width LW2, which is a relatively large dimension, may be formed in the low-density region B. The large width LW2 may be several tens of nm. The line patterns 352 and 354 may constitute a plurality of active regions formed in the cell array region, and the second wide-width line pattern 356 may constitute the peripheral region. Also, the line patterns 352 and 354 may constitute a plurality of fine conductive patterns formed in the cell array region, and the second wide-width line pattern 356 may constitute a conductive pattern having a relatively large width formed in the peripheral region or the cell array region. Alternatively, the second wide-width line pattern 356 may constitute an alignment key.

Although FIG. 5 illustrate a case in which the high-density region A and the low-density region B are separated from each other for brevity, the high-density region A and the low-density region B may be connected to each other. For example, the line patterns 352 formed in the high-density region A may be connected to the second wide-width line pattern 356 formed in the low-density region B.

A method of forming the semiconductor device 300 of FIG. 5 according to an example embodiment will now be described with reference to FIGS. 6A to 6I and FIGS. 7A to 7F.

FIGS. 6A to 6I are cross-sectional views of process operations of a method of forming line patterns of a semiconductor device according to an example embodiment. FIGS. 7A to 7F are plan views of process operations of a method of forming line patterns of a semiconductor device according to an example embodiment.

In FIGS. 6A to 6I, portions taken along a line X2-X2' of FIG. 5 are illustrated in the low-density region B. FIGS. 7A to 7F are plan views of the high-density region A of FIGS. 6A to 6I, which illustrate sequential process operations. Lines X3-X3' of FIGS. 7A to 7F may correspond to a line X1-X1' of FIG. 5.

Figure 6A:
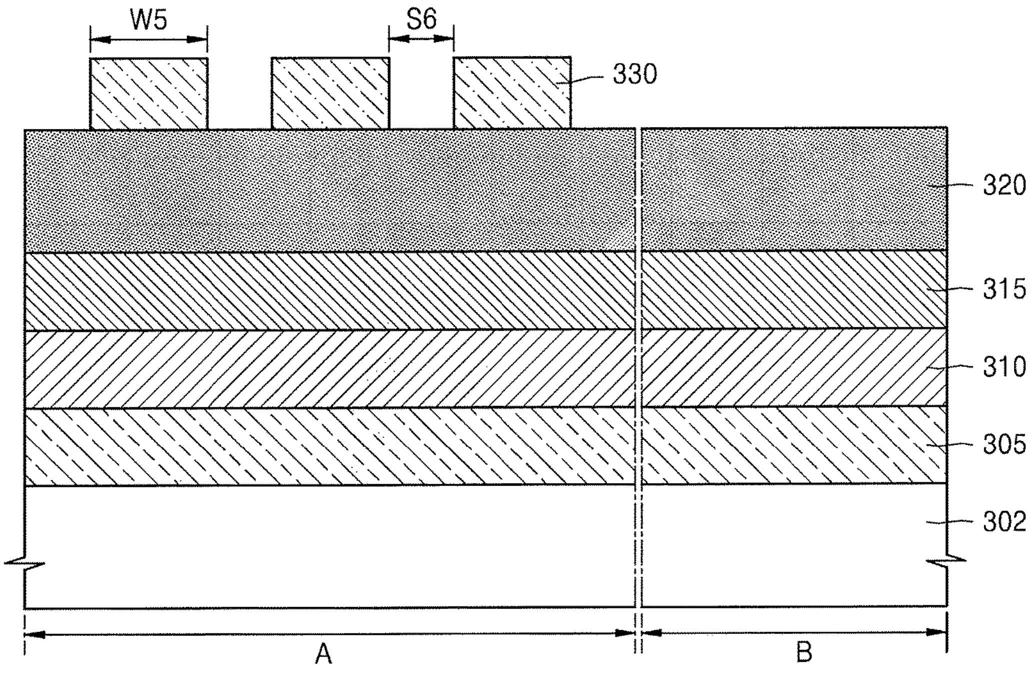
FIGS. 6A to 6I are cross-sectional views of stages in a method of forming line patterns of a semiconductor device according to an example embodiment.
Figure 7A:
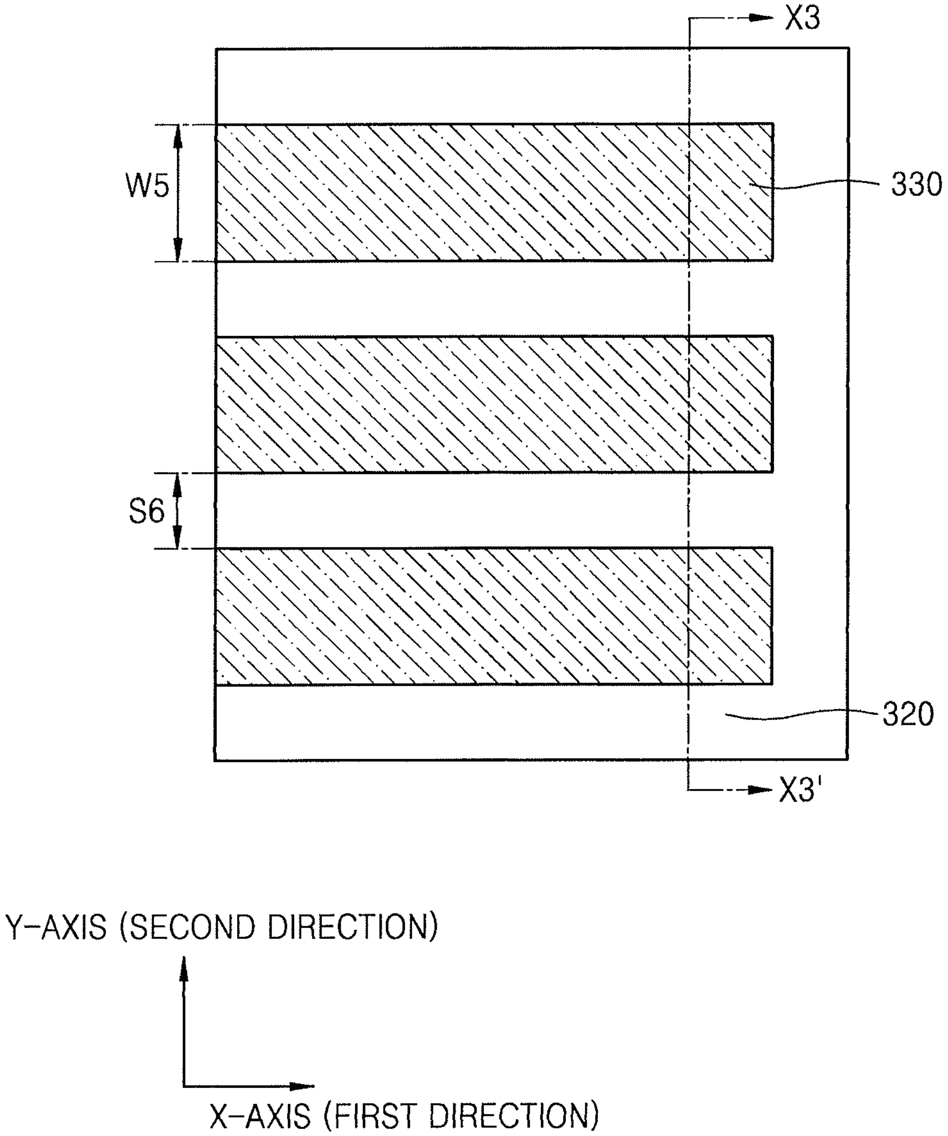
FIGS. 7A to 7F are plan views of stages in a method of forming line patterns of a semiconductor device according to an example embodiment.

Referring to FIGS. 6A and 7A, an interlayer insulating layer 305, a first hard mask layer 310, a second hard mask layer 315, and a third hard mask layer 320 may be formed on the high-density region A and the low-density region B of a substrate 302. First mandrel patterns 330 may be formed on the third hard mask layer 320 formed on the high-density region A. The first hard mask layer 310, the second hard mask layer 315, and the third hard mask layer 320 may be formed of a silicon nitride layer, a poly-Si layer, or a carbon layer.

The first mandrel patterns 330 may correspond to the first mandrel patterns 230 of FIGS. 3A and 4. As shown in FIG. 7A, the first mandrel patterns 330 may extend in a first direction (X-axis) and be spaced apart from one another in a second direction (Y-axis) perpendicular to the first direction.

The first mandrel patterns 330 may be formed on the third hard mask layer 320 only in the high-density region A but not formed in the low-density region B. The substrate 302 may be a semiconductor substrate, such as a silicon substrate. Elements (e.g., source and drain regions and a gate electrode) constituting a semiconductor device may be formed on the substrate 302 under the interlayer insulating layer 305.

The first mandrel patterns 330 may have a width W5. The first mandrel patterns 330 may be formed a space S6 apart from one another. The width W5 of the first mandrel patterns 330 and the space S6 between the first mandrel patterns 330 may be determined by a target width of line patterns to be finally formed. In particular, the space S6 between the first mandrel patterns 330 may be determined by a minimum feature size 1F of the line patterns to be finally formed. The space S6 may be larger three times (3F) the minimum feature size and smaller than four times (4F) the minimum feature size.

The third hard mask layer 320 may be exposed by as much as a width, which is larger than 3F and smaller than 4F, by the space S6 between the first mandrel patterns 330. The first mandrel patterns 330 may be formed of a material having an etch selectivity with respect to the third hard mask layer 320.

Figure 6B:
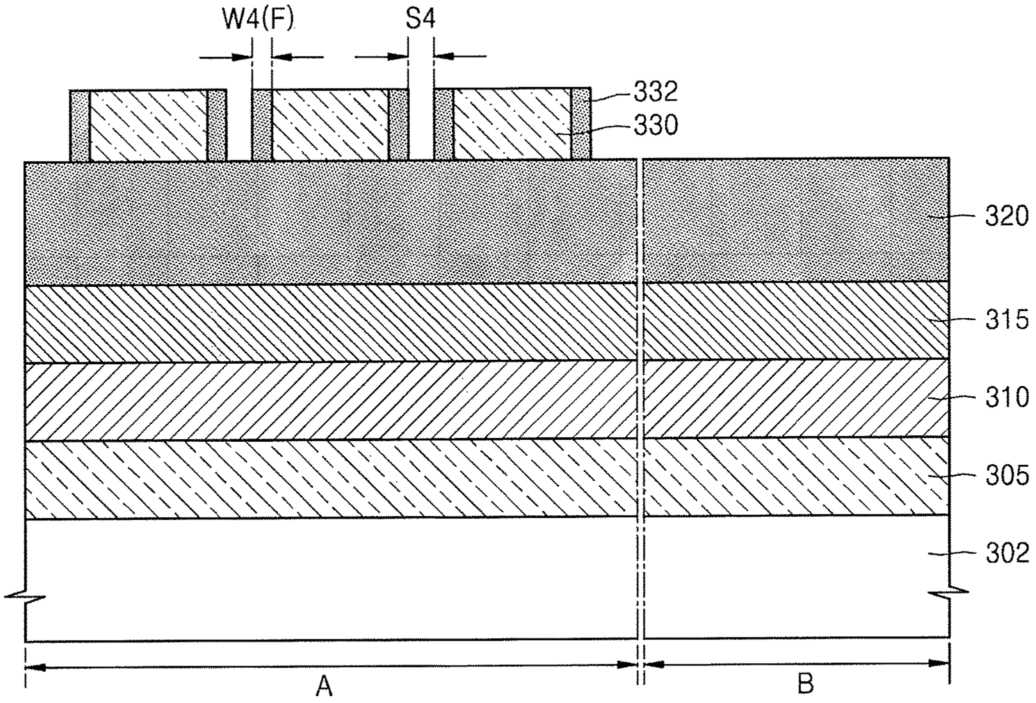
Figure 7B:
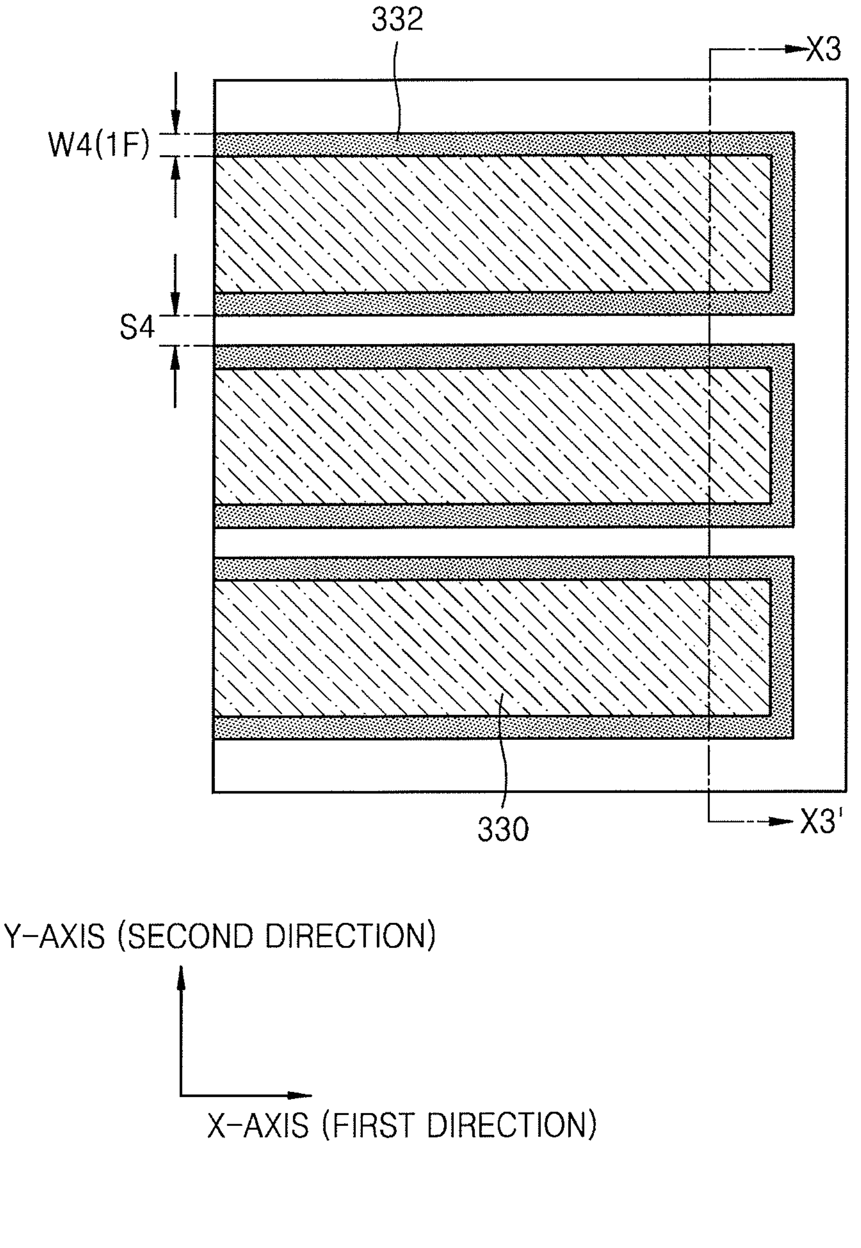

Referring to FIGS. 6B and 7B, a first spacer layer (not shown) may be formed in the high-density region A and the low-density region B to cover the surface of the first mandrel patterns 330 and the exposed surface of the third hard mask layer 320. The first spacer layer may be etched back until a top surface of the third hard mask layer 320 is exposed so that first spacer patterns 332 may be formed on two sidewalls of the first mandrel patterns 330 in the high-density region A. Although FIG. 6B illustrates the first spacer patterns 332 having rectangular shapes, upper portions of the first spacer patterns 332 may be etched back and rounded.

The first spacer patterns 332 may be formed of a material having an etch selectivity with respect to each of the first mandrel patterns 330 and the third hard mask layer 320. As shown in FIG. 7B, the first spacer patterns 332 may extend in a first direction (X-axis) and be arranged apart from one another in a second direction perpendicular to the first direction. The first spacer patterns 332 may be formed to surround the first mandrel patterns 330.

A width W4 of the first spacer patterns 332 may be set to be equal to the minimum feature size 1F. The first spacer patterns 332 formed on the sidewalls of the first mandrel patterns 330 may be arranged apart from one another by a space S4. The space S4 between the first spacer patterns 332 may be planarly the same as described with reference to FIG. 3B.

Figure 6C:
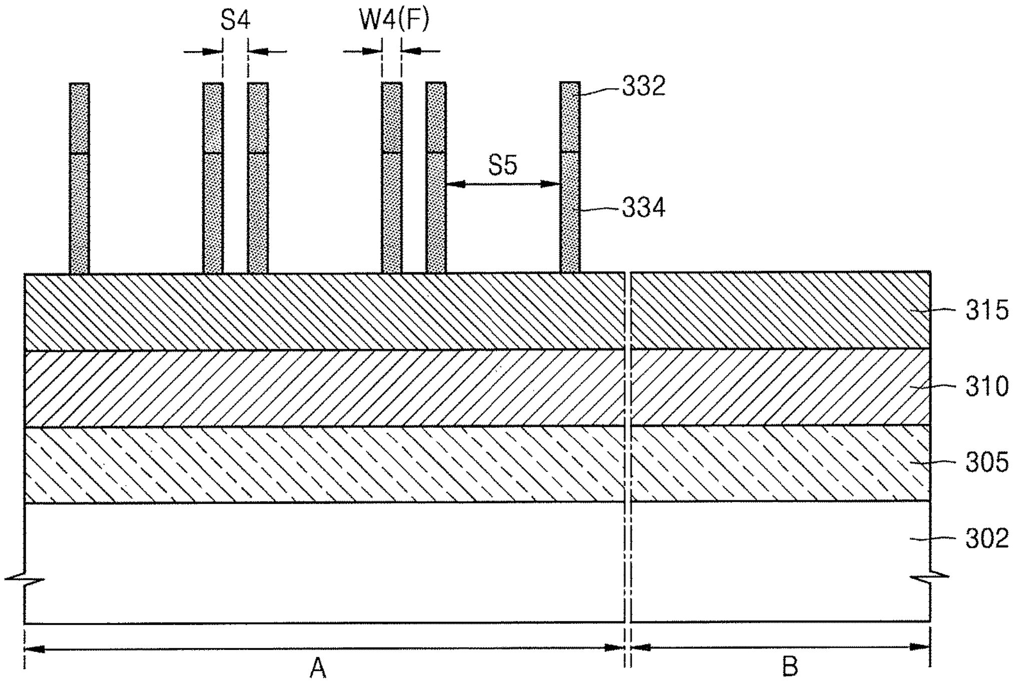
Figure 7C:
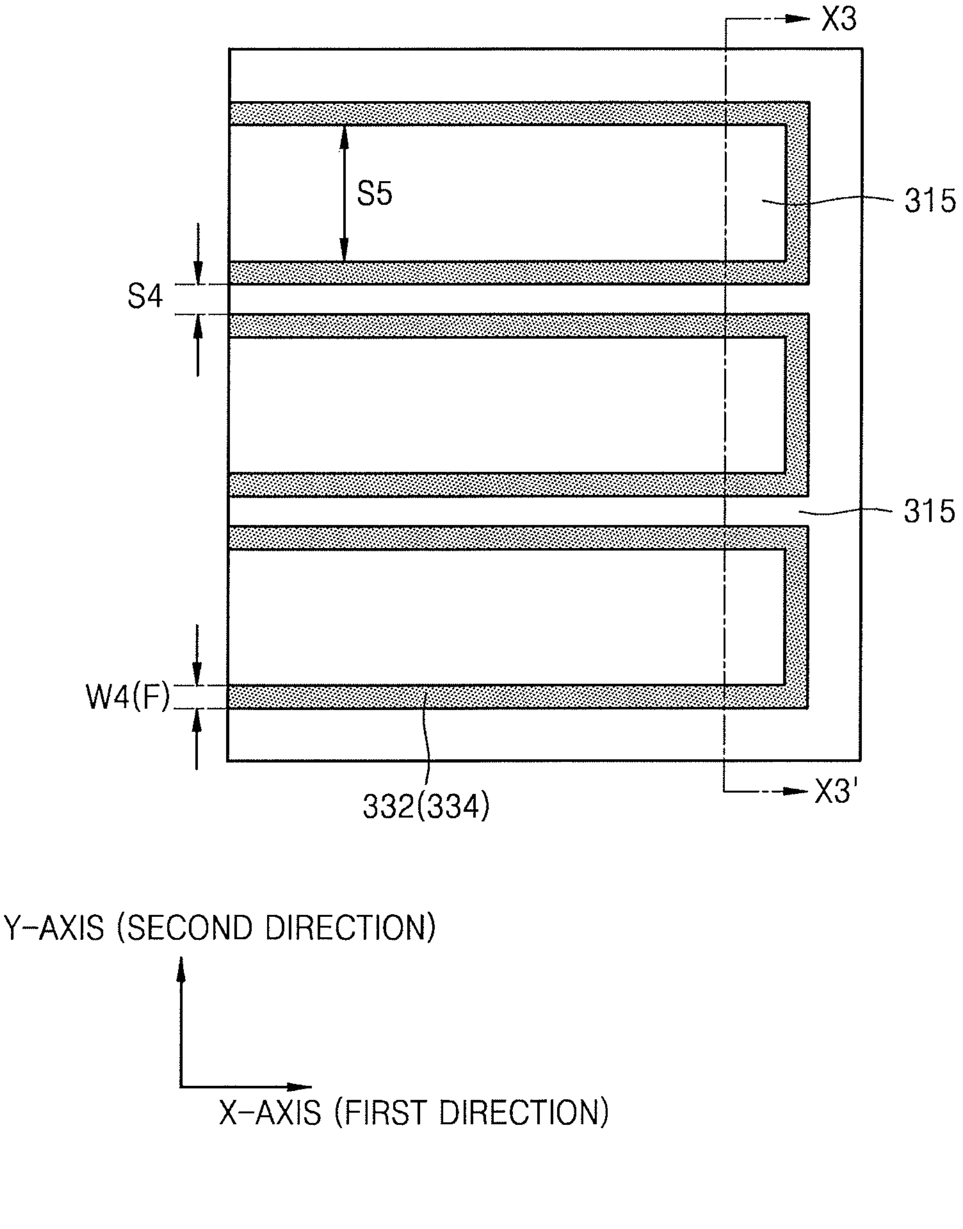

Referring to FIGS. 6C and 7C, the first mandrel patterns 330 may be etched and removed as shown in FIG. 6C. The third hard mask layer 320 may be etched by performing a self-alignment method by using the first spacer patterns 332 as an etch mask in the high-density region A and the low-density region B so that third hard mask patterns 334 may be formed in the high-density region A.

The third hard mask patterns 334 may correspond to the second mandrel patterns 234 of FIG. 3C. The third hard mask patterns 334 may have the width W4 like the first spacer patterns 332. The width W4 of the third hard mask patterns 334 may be set to be equal to the minimum feature size 1F. The width W4 of the third hard mask patterns 334 and the spaces S4 and S5 between the third hard mask patterns 334 may be planarly the same as described with reference to FIG. 3C.

Figure 6D:
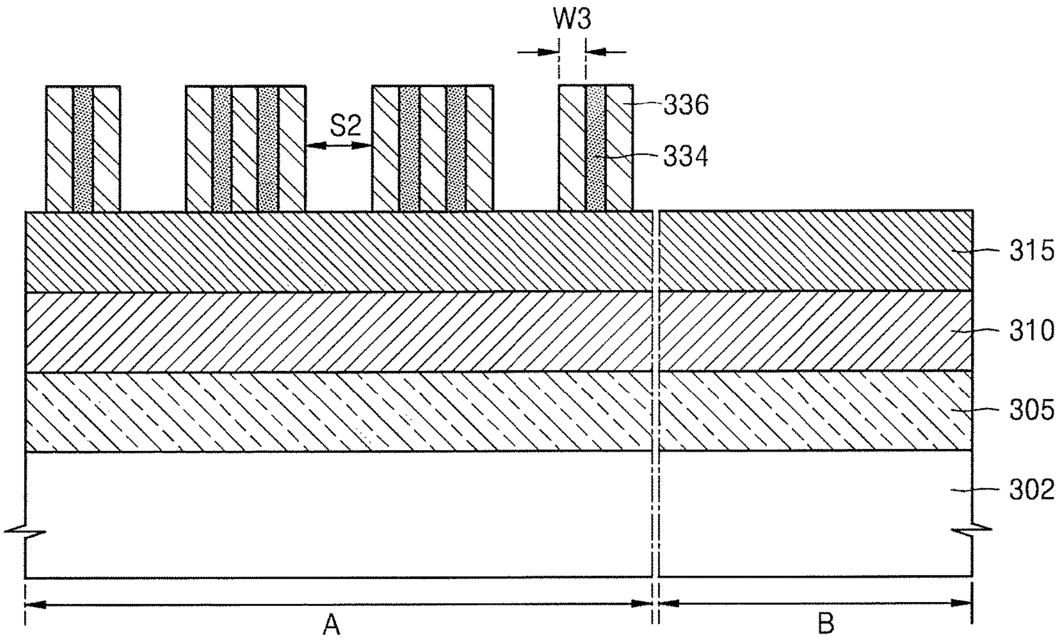
Figure 7D:
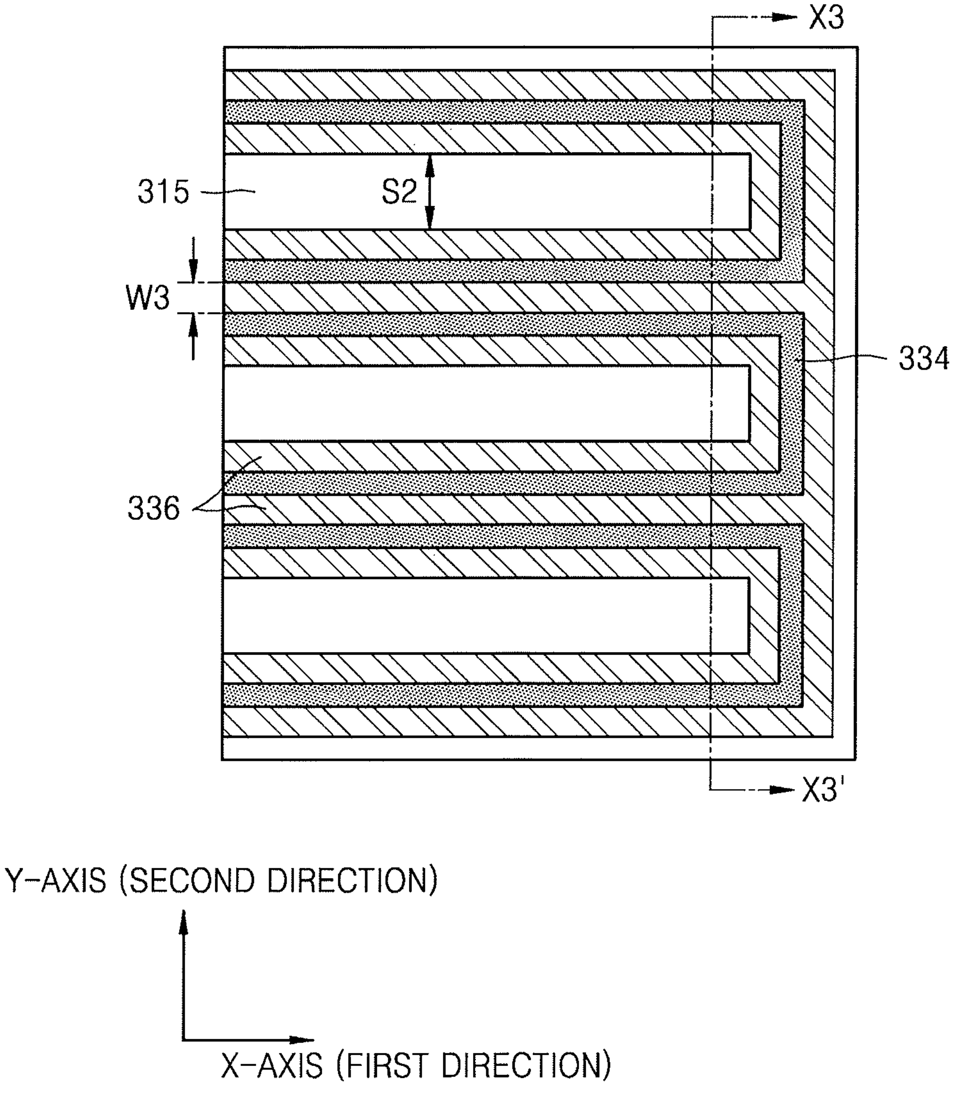

Referring to FIGS. 6D and 7D, after the first spacer patterns 332 are removed, second spacer patterns 336 may be formed on two sidewalls of the third hard mask patterns 334. Although FIG. 6D illustrates the second spacer patterns 336 having rectangular shapes, upper portions of the second spacer patterns 336 may be etched back and rounded.

The second spacer patterns 336 may have a width W3. A space S4 between the third hard mask patterns 334 arranged under spaces between the first mandrel patterns 330 shown in FIGS. 6C and 7C may correspond to the width W3 of the second spacer patterns 336.

Thus, the second spacer patterns 336 may completely fill spaces between the first spacer patterns 332 arranged under the first mandrel patterns 330. When the spaces between the first spacer patterns 332 arranged under the first mandrel patterns 330 are completely filled with the second spacer patterns 336, line patterns may not be formed under the second spacer patterns 336 in a subsequent process. A space S2 between the second spacer patterns 336 in a plan view may be the same as described with reference to FIG. 3D.

Figure 6E:
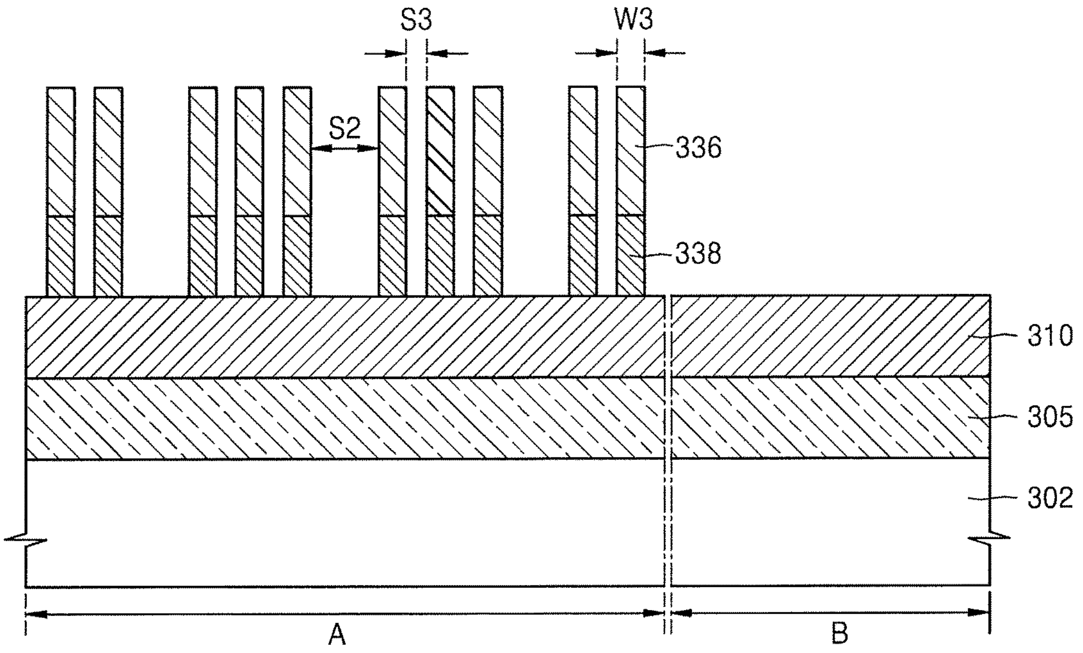
Figure 7E:
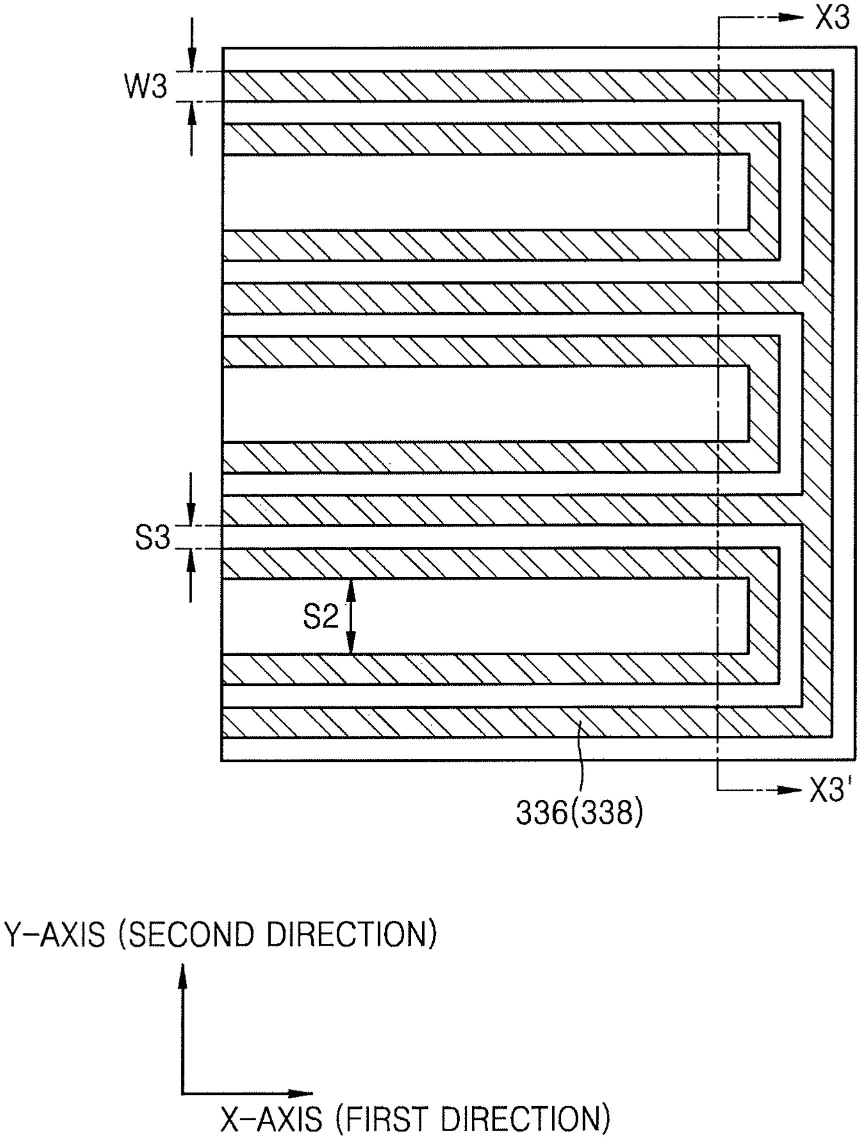

Referring to FIGS. 6E and 7E, the third hard mask patterns 334 may be removed. Thereafter, the second hard mask layer 315 may be etched by performing a self-alignment method by using the second spacer patterns 336 as an etch mask so that second hard mask patterns 338 may be formed in the high-density region.

The second hard mask patterns 338 arranged under the first mandrel patterns 330 may be arranged apart from one another by the space S2. The second hard mask patterns 338 arranged under the third hard mask patterns 334 may be arranged apart from one another by a space S3. The spaces S2 and S3 between the second hard mask patterns 338 may be the same as described with reference to FIG. 3D.

Figure 6F:
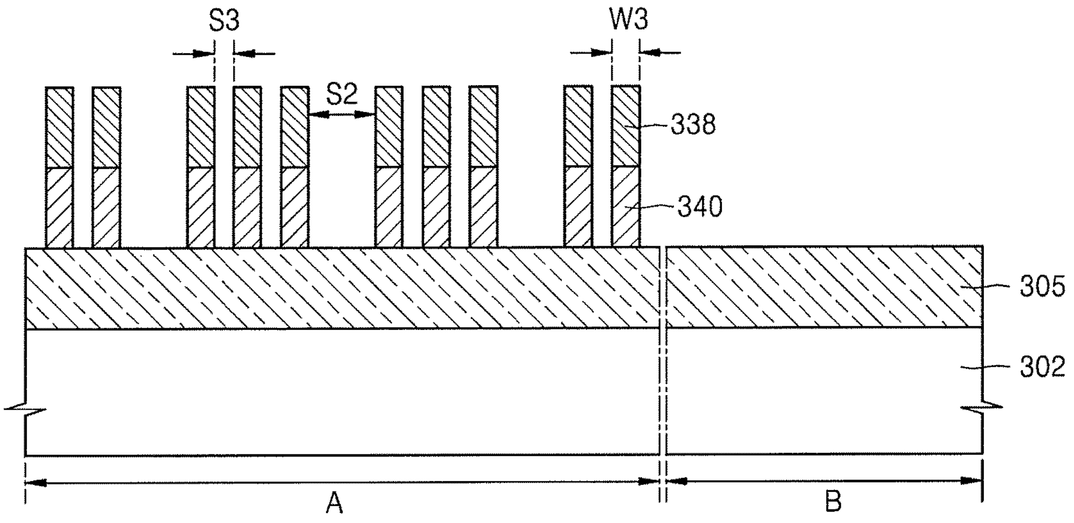
Figure 6G:
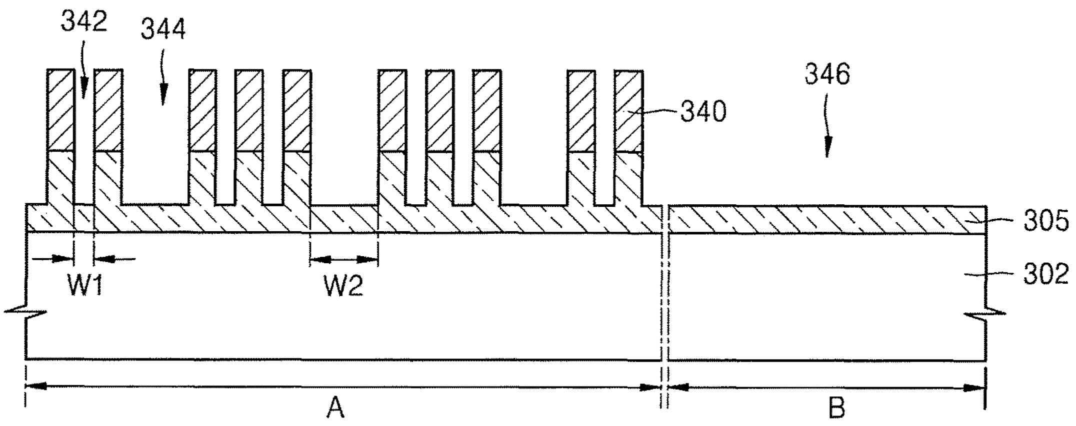

Referring to FIGS. 6F and 6G, the second spacer patterns 336 are removed, and the first hard mask layer 310 may be etched by means of a self-alignment method by using the second hard mask patterns 338 as an etch mask, thereby forming first hard mask patterns 340.

Subsequently, as shown in FIG. 6G, the second hard mask patterns 338 are removed, and the interlayer insulating layer 305 may be etched by means of a self-alignment method by using the first hard mask patterns 340 as an etch mask, thereby forming a plurality of trenches, for example, trenches 342, 344, and 346. As a result, a width W1 of the trenches 342 formed in the high-density region A may be the minimum feature size 1F of line patterns in a subsequent process. A width W2 of the trenches 344 formed in the high-density region A may be a width of wide-width line patterns in a subsequent process.

Figure 6H:
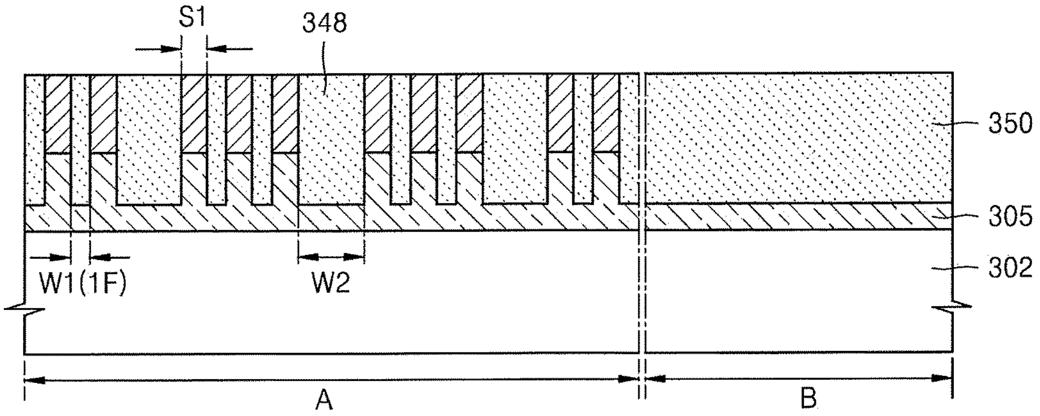
Figure 6I:
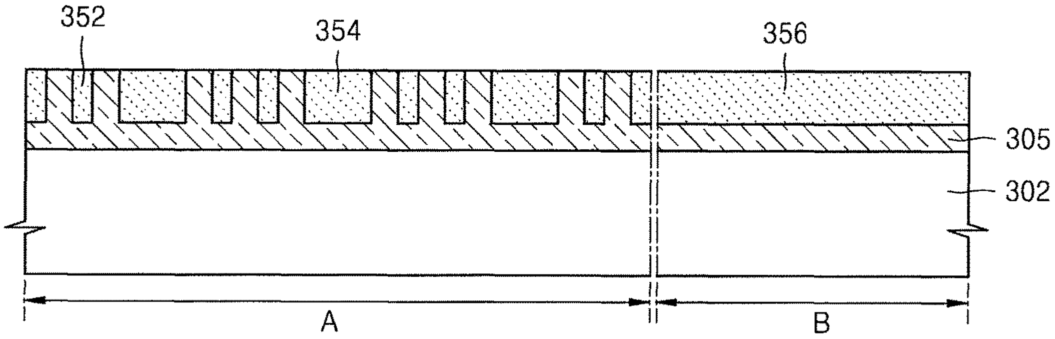
Figure 7F:
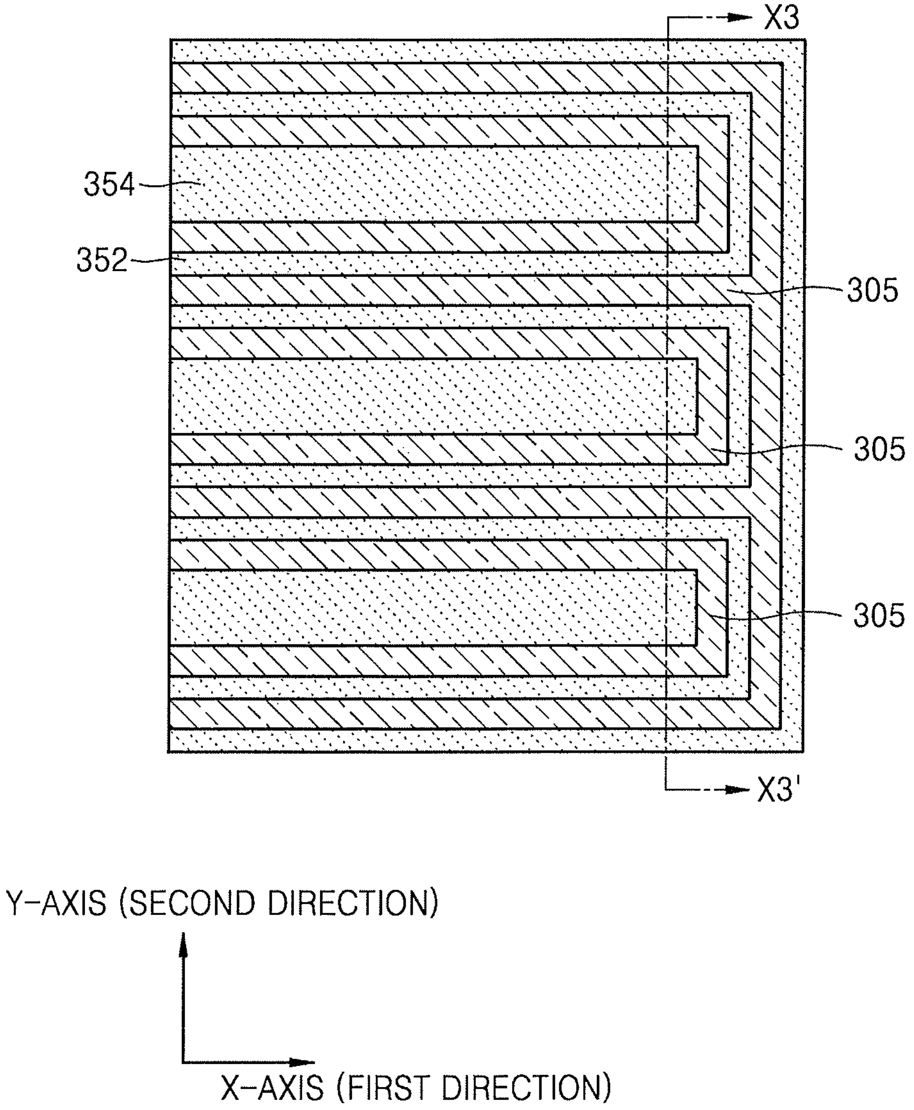

Referring to FIGS. 6H, 6I, and 7F, conductive layers 348 and 350 may be formed in the trenches 342, 344, and 346 as shown in FIG. 6H. Thereafter, as shown in FIG. 6I, the conductive layer 348 and 350 may be etched back to form line patterns 352, 354, and 356. The line patterns 352, 354, and 356 may be formed by using a damascene process.

The width W1 of the line pattern 352 formed in the high-density region A may be the minimum feature size 1F. The line pattern 354 may be a wide-width line pattern having the width W2 larger than the line pattern 352. The line patterns 352 and 354 may be arranged apart from one another by the space S1. The second wide-width line pattern 356 may be formed in the low-density region B.

Figure 8:
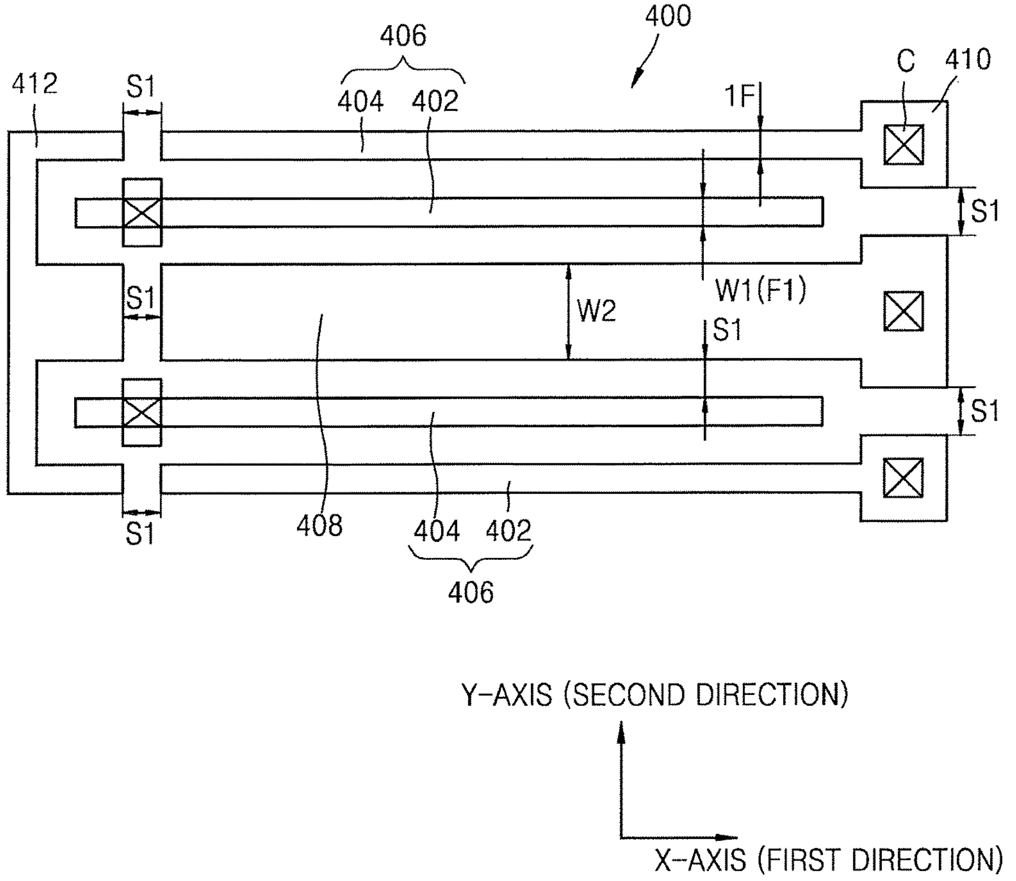
FIG. 8 is a partial layout diagram of a semiconductor device having line patterns according to an example embodiment.

FIG. 8 is a partial layout diagram of a semiconductor device having line patterns 400 according to an example embodiment.

Specifically, the line patterns 400 may include a line pattern set 406 including two sub-line patterns 402 and 404 having a first width W1. A first width W1 of the sub-line patterns 402 and 404 that constitute the line pattern set 406 may be a minimum feature size 1F. The line patterns 400 may include a wide-width line pattern 408, which may be arranged apart from one side of the line pattern set 406 by a first space S1 in a second direction and have a second width W2 larger than the first width W1 in the second direction.

The line patterns 400 may correspond to the line patterns 110 and 210 of FIGS. 1 and 2. Contact pads C may be formed on respective one-sides of the line patterns 400. The contact pads C may be connected to the sub-line patterns 402 and 404 and the wide-width line pattern 408. The contact pads C may be formed in a sequential order on portions of the sub-line patterns 404 and 402 and the wide-width line pattern 408, which are opposite one another in the first direction.

Protruding patterns 410 having a larger width than the sub-line patterns 402 and 404 and the wide-width line pattern 408 may be connected to right end portions of the line patterns 400. The contact pads C may be formed on the protruding patterns 410. Adjacent protruding patterns 410 may be arranged apart from one another by a space S1. The space S1 may be larger than the minimum feature size 1F and smaller than double (2F) the minimum feature size 1F. Accordingly, the protruding patterns 410 may not be connected to one another but formed as independent patterns.

Left end portions of the line patterns 400 may be formed in line shapes, and protruding patterns may not be formed in the left end portions of the line patterns 400. An E-shaped auxiliary pattern 412 may be formed in the left end portions of the line patterns 400 to be apart from the sub-line patterns 402 and 404 and the wide-width line pattern 408. The auxiliary pattern 412 may be arranged apart from the sub-line patterns 402 and 404 by the space S1. As described above, the sub-line patterns 402 and 404, the wide-width line pattern 408, and the auxiliary pattern 412 may not be connected to one another but formed as independent patterns.

Figure 9:
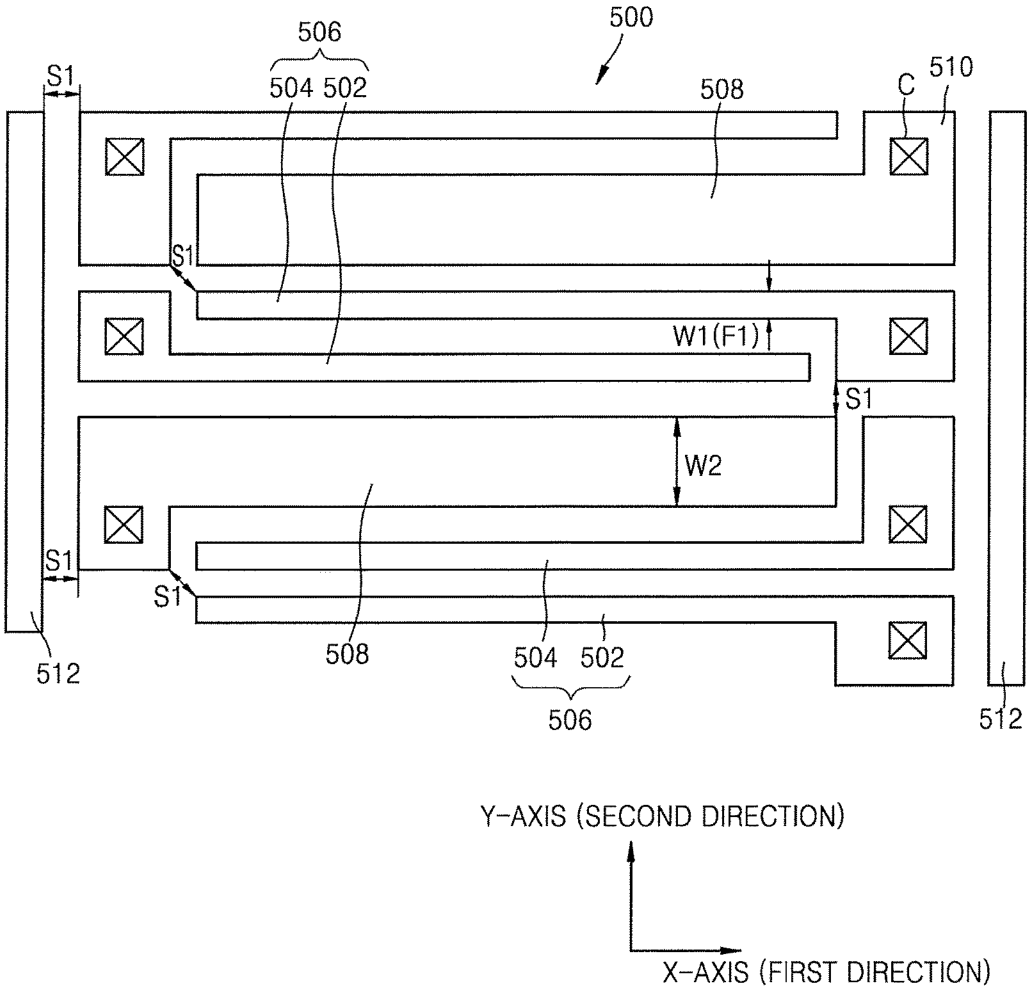
FIG. 9 is a partial layout diagram of a semiconductor device having line patterns according to an example embodiment.

FIG. 9 is a partial layout diagram of a semiconductor device having line patterns 500 according to an exemplary embodiment.

Specifically, the line patterns 500 may include a line pattern set 506 including two sub-line patterns 502 and 504 having a first width W1. The first width W1 of the sub-line patterns 502 and 504 constituting the line pattern set 506 may be a minimum feature size 1F. The line patterns 500 may include a wide-width line pattern 508, which may be arranged a first space S1 apart from one side of the line pattern set 506 in a second direction and have a second width W2 larger than the first width W1 in the second direction.

The line patterns 500 may correspond to the line patterns 110 and 210 of FIGS. 1 and 2. Contact pads C may be formed on one side of the line patterns 500. The contact pads C may be connected to the sub-line patterns 502 and 504 and the wide-width line pattern 508. The contact pads C may be formed in a sequential order along two lines on portions of the sub-line patterns 502 and 504 and the wide-width line pattern 508 in the second direction, which are opposite one another in the first direction Protruding patterns 510 having a larger width than the sub-line patterns 502 and 504 and the wide-width line pattern 508 may be connected to left and right end portions of the line patterns 500. The contact pads C may be formed on the protruding patterns 510. The protruding patterns 510 may alternately protrude from the line patterns 500 in a positive second direction and a negative second direction. Adjacent protruding patterns 510 may be arranged the first space (or separation distance) S1 apart from one another. The first space S1 may be larger than the minimum feature size 1F and smaller than double (2F) the minimum feature size 1F. Accordingly, the protruding patterns 510 may not be connected to each other but formed as independent patterns.

Furthermore, rod-shaped auxiliary patterns 512 may be formed in left and right end portions of the line patterns 500 to be apart from the sub-line patterns 502 and 504 and the wide-width line pattern 508. The auxiliary patterns 512 may be arranged apart from the sub-line patterns 502 and 504 and the wide-width line pattern 508 by the first space S1. As described above, the sub-line patterns 502 and 504, the wide-width line pattern 508, and the auxiliary pattern 512 may not be connected to one another but formed as independent patterns.

Figure 10:
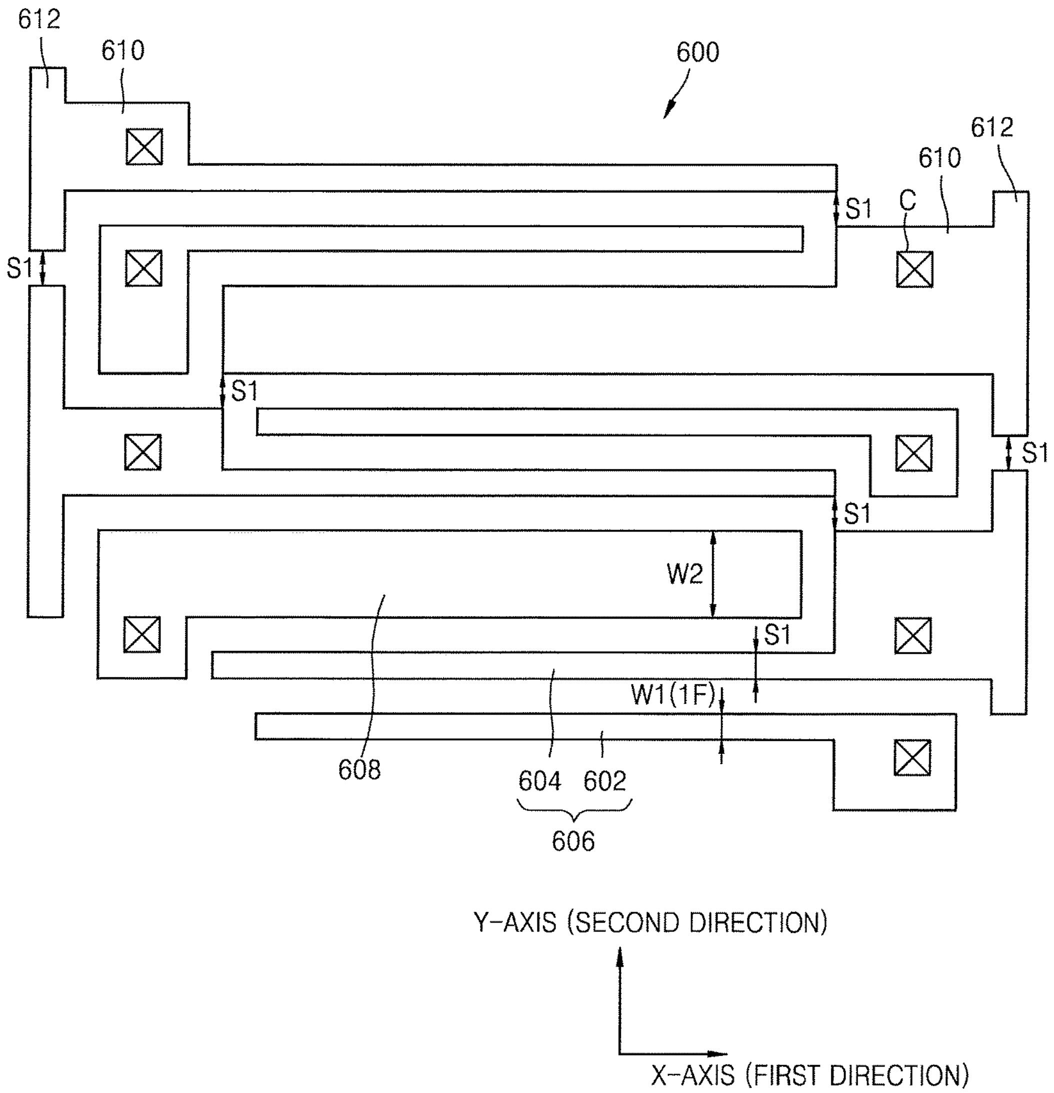
FIG. 10 is a partial layout diagram of a semiconductor device having line patterns according to an example embodiment.

FIG. 10 is a partial layout diagram of a semiconductor device having line patterns 600 according to an example embodiment.

Specifically, the line patterns 600 may include a line pattern set 606 including two sub-line patterns 602 and 604 having a first width W1. The first width W1 of the sub-line patterns 602 and 604 constituting the line pattern set 606 may be the minimum feature size 1F. The line patterns 600 may include a wide-width line pattern 608, which may be arranged apart from one side of the line pattern set 606 by the first space S1 in a second direction and have a second width W2 larger than the first width W1 in the second direction.

The line patterns 600 may correspond to the line patterns 110 and 210 of FIGS. 1 and 2. Contact pads C may be formed on respective one side of the line patterns 600. The contact pads C may be connected to the sub-line patterns 602 and 604 and the wide-width line pattern 608. The contact pads C may be formed in a sequential order along two lines on portions of the sub-line patterns 602 and 604 and the wide-width line pattern 608 in the second direction, which are opposite one another in the first direction.

Protruding patterns 610 having a larger width than the sub-line patterns 602 and 604 and the wide-width line pattern 608 may be connected to left and right end portions of the line patterns 600. The contact pads C may be formed in the protruding patterns 610. The protruding patterns 610 may alternately protrude from the left and right end portions of the line patterns 600 in a negative second direction and a positive second direction.

Adjacent protruding patterns 610 may be arranged the first space (or separation distance) S1 apart from one another. The space S1 may be larger than the minimum feature size 1F and smaller than double (2F) the minimum feature size 1F. Accordingly, the protruding patterns 610 may not be connected to one another but formed as independent patterns.

Furthermore, auxiliary patterns 612 may be formed in the left and right end portions of the line patterns 600. The auxiliary patterns 612 may be connected to the sub-line patterns 604 and the protruding patterns 610 and arranged apart from one another. A space between the protruding patterns 610, a space between the auxiliary patterns 612, and a space between the protruding patterns 610 and the auxiliary patterns 612 may be the first space S1. As described above, the protruding patterns 610 and the auxiliary patterns 612 may not be connected to one another but formed as independent patterns.

Figure 11:
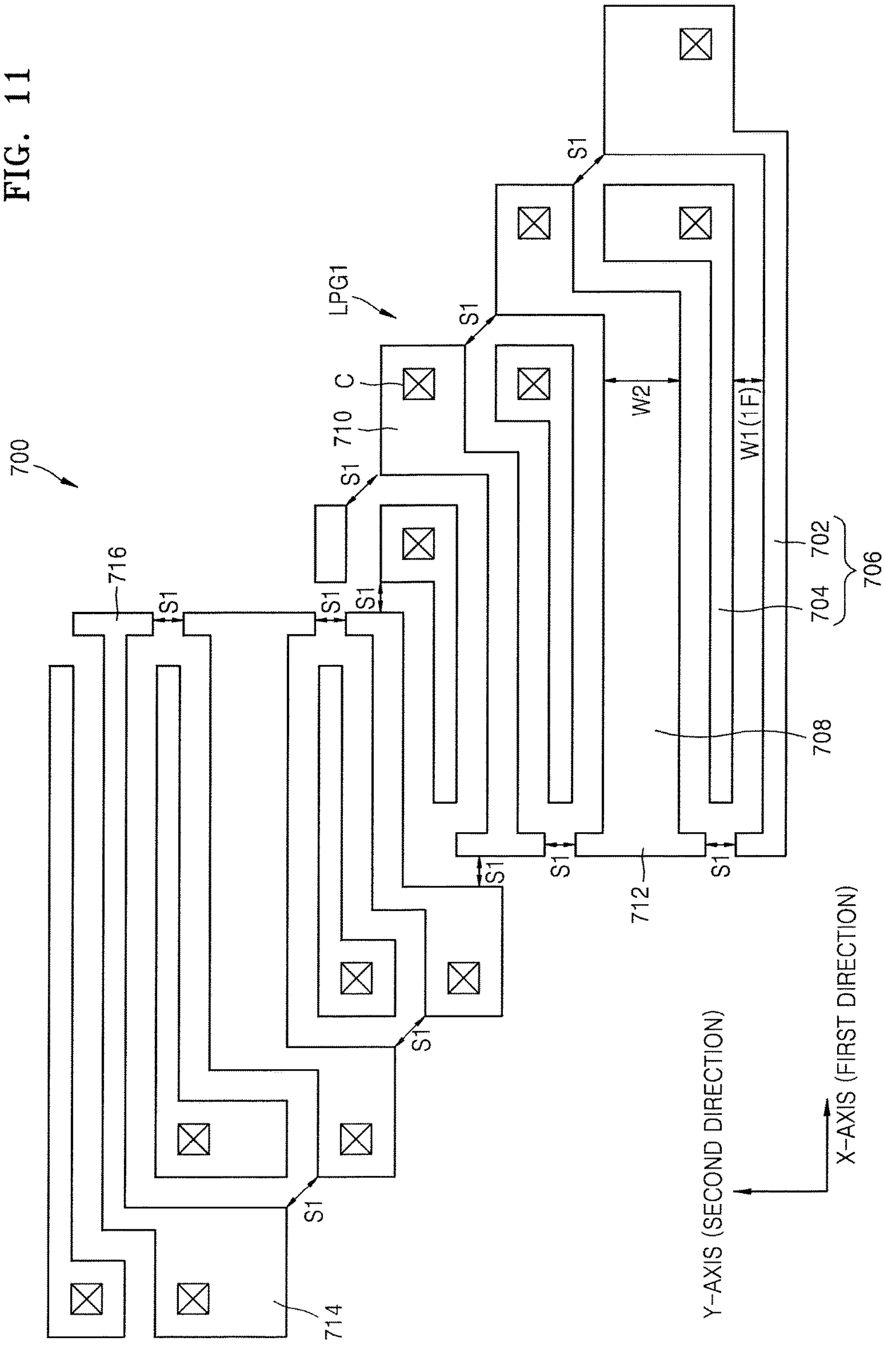
FIG. 11 is a partial layout diagram of a semiconductor device having line patterns according to an example embodiment.

FIG. 11 is a partial layout diagram of a semiconductor device having line patterns 700 according to an example embodiment.

Specifically, the line patterns 700 may include a line pattern set 706 including two sub-line patterns 702 and 704 having a first width W1. A first width W1 of the sub-line patterns 702 and 704 constituting the line pattern set 706 may be a minimum feature size 1F. The line patterns 700 may include a wide-width line pattern 708, which may be arranged apart from one side of the line pattern set 706 by a first space S1 in a second direction and have a second width W2 larger than the first width W1 in the second direction.

The line patterns 700 may correspond to the line patterns 110 and 210 of FIGS. 1 and 2. Contact pads C may be formed on respective one side of the line patterns 700. The contact pads C may be connected to the sub-line patterns 702 and 704 and the wide-width line pattern 708. The contact pads C may be formed in a sequential order along six lines on portions of the sub-line patterns 702 and 704 and the wide-width line pattern 708 in the second direction, which are opposite one another in the first direction. The contact pads C may be formed in a sequential order along three lines, four lines, or five lines on portions of the sub-line patterns 702 and 704 and the wide-width line pattern 708 in the second direction, which are opposite one another in the first direction, as needed.

Protruding patterns 710 having a larger width than the sub-line patterns 702 and 704 and the wide-width line pattern 708 may be connected to a right end portion of a first group LPG1 of the line patterns 700. The contact pads C may be formed on the protruding patterns 710. The protruding patterns 710 may protrude from right end portions of the line patterns 600 in the second direction. Auxiliary patterns 712 may be formed on a right end portion of the first group LPG1 of the line patterns 700 and connected to the sub-line patterns 702 and 704 and the wide-width line pattern 708.

A space (or separation distance) between adjacent patterns of the protruding patterns 710 and the auxiliary patterns 712 may be the first space S1. The first space S1 may be larger than the minimum feature size 1F and smaller than double (2F) the minimum feature size 1F. Accordingly, the protruding patterns 710 and the auxiliary patterns 712 may not be connected to one another but formed as independent patterns.

Protruding patterns 714 having a larger width than the sub-line patterns 702 and 704 and the wide-width line pattern 708 may be connected to a left end portion of a second group LPG2 of the line patterns 700. Contact pads C may be funned on the protruding patterns 714. The protruding patterns 714 may protrude from a left end portion of the line patterns 700 in a negative second direction. Auxiliary patterns 716 may be formed on a right end portion of the second group LPG2 of the line patterns 700 and connected to the sub-line patterns 702 and 704 and the wide-width line pattern 708.

A space (or separation distance) between adjacent patterns of the protruding patterns 714 and the auxiliary patterns 716 may be the first space S1. The first space S1 may be larger than the minimum feature size (1F) and smaller than double (2F) the minimum feature size. Accordingly, the protruding patterns 714 and the auxiliary patterns 716 may not be connected to one another but formed as independent patterns.

Figure 12:
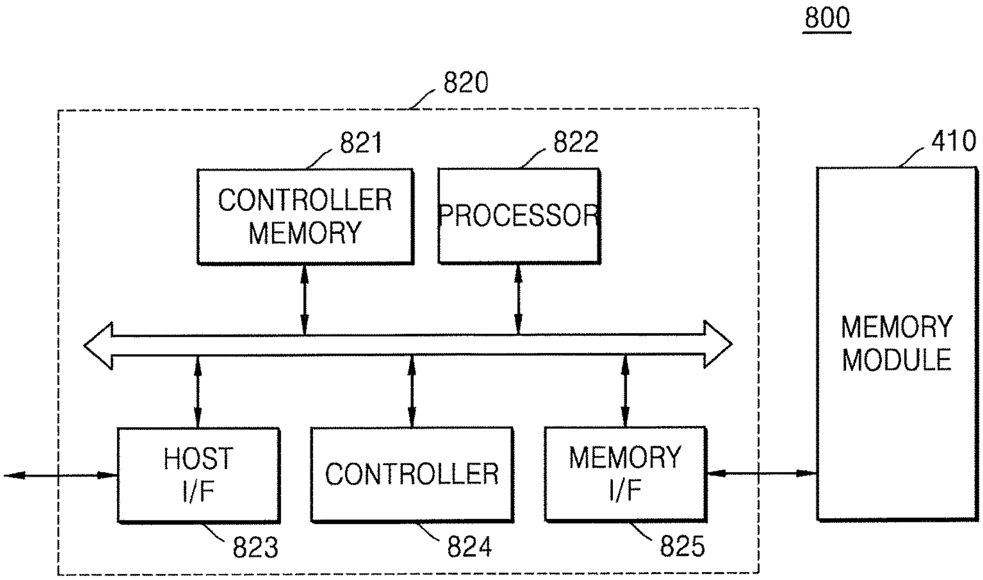
FIG. 12 is a block diagram of a memory card including a semiconductor device according to an example embodiment.

FIG. 12 is a block diagram of a memory card 800 including a semiconductor device according to an example embodiment.

Referring to FIG. 12, the memory card 800 may include a memory controller 820 configured to generate commands and address signals C/A and a memory module 810, for example, a flash memory including one or a plurality of flash memory devices. The memory controller 820 may include a host interface 823 configured to transmit the commands and the address signals C/A to a host or receive the commands and address signal C/A from the host, and a memory interface 825 configured to transmit the commands and address signals C/A to the memory module 810 again or receive the commands and address signals C/A from the memory module 810. The host interface 823, the controller 824, and the memory interface 825 may communicate with a controller memory 821 (e.g., SRAM) and a processor 822 (e.g., a CPU) via a common bus.

The memory module 810 may receive the commands and address signals C/A from the memory controller 820, store data in at least one of memory devices formed on the memory module 810 in response to the commands and address signals C/A, and search for data from at least one of the memory devices. Each of the memory devices may include a plurality of addressable memory cells and a decoder configured to receive commands and address signals C/A and generate a row signal and a column signal to access at least one of the addressable memory cells during program and read operations.

Each of elements of the memory card 800 including the memory controller 820, electronic devices 821, 822, 823, 824, and 825 included in the memory controller 820, and the memory module 810 may include a semiconductor including line patterns according to one of exemplary embodiments.

Figure 13:
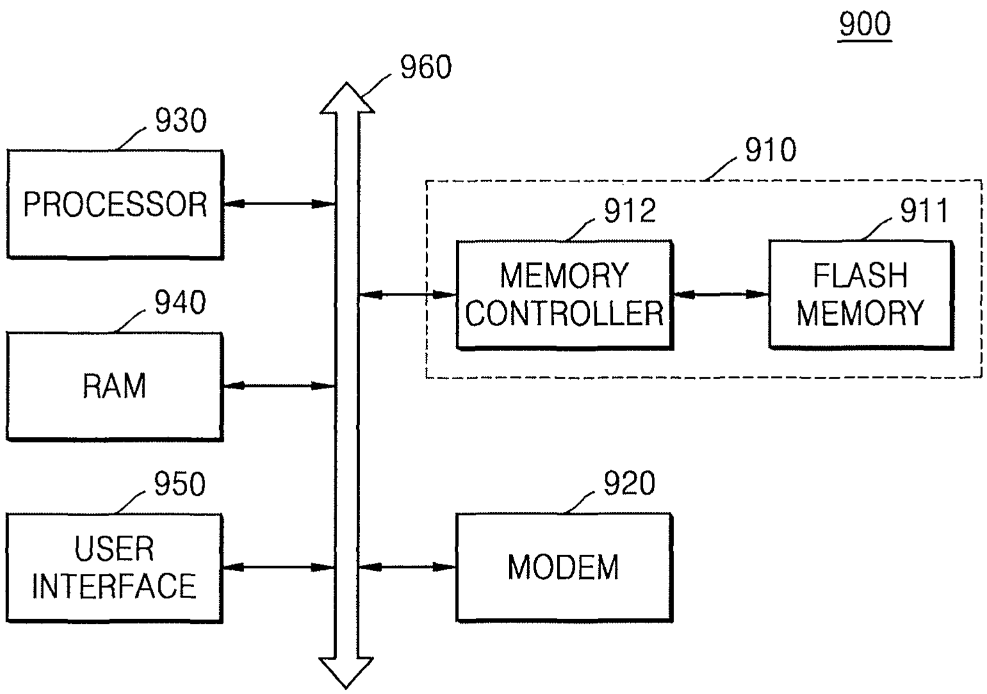
FIG. 13 is a block diagram of a memory system including a semiconductor device according to an example embodiment.

FIG. 13 is a block diagram of a memory system 900 including a semiconductor device according to an example embodiment.

Specifically, the memory system 900 may include a processor 930 (e.g., a CPU), a random access memory 940, a user interface 950, and a modem 920, which may communicate with one another via a common bus 960. Each of the elements of the memory system 900 may transmit signals to a memory card 910 through the common bus 960 and receive the signals from the memory card 910. The memory card 910 may include a memory controller 912 and a flash memory 911.

Each of the elements of the memory system 900 including the memory card 910, the processor 930, the random access memory 940, the user interface 950, and the modem 920 may include a semiconductor device including line patterns according to one of exemplary embodiments. The memory system 900 may be applied in various electronic application fields. For instance, the memory system 900 may be applied to solid-state drives (SSDs), complementary-metal-oxide semiconductor (CMOS) image sensors (CISs), and computer application chip sets.

The memory systems and memory devices disclosed herein may be packaged by any one of various semiconductor packages including ball grid arrays (BGAs), chip-scale packages (CSPs), plastic leaded chip carriers (PLCCs), plastic dual in-line packages (PDIPs), multi-chip packages (MCPs), wafer-level fabricated packages (WFPs), and wafer-level processed stock packages (WSPs), but embodiments are not limited thereto.

While embodiments have been particularly shown and described with reference to exemplary embodiments thereof, it will be understood that various changes in form and details may be made therein without departing from the spirit and scope of the following claims.

What is claimed is:

1. A semiconductor device, comprising:

a plurality of line patterns extending in a first direction and being arranged apart from one another by a first space in a second direction perpendicular to the first direction, as viewed in a plan view, wherein the plurality of line patterns include:

a line pattern set including two sub-line patterns that are arranged apart from each other by the first space in the second direction and each of the two sub-line patterns has a first width of a minimum feature size (1F) in the second direction, and a wide-width line pattern that is arranged apart from one side of the line pattern set by the first space in the second direction and has a second width greater than the first width in the second direction, wherein a plurality of wide-width line patterns are arranged apart from two sides of the line pattern set by the first space, in the second direction, wherein the line patterns are conductive line patterns.

2. The device of claim 1, wherein the first space between the line patterns is determined by the minimum feature size.

3. The device of claim 2, wherein the first space between the line patterns is greater than the minimum feature size and less than double (2F) the minimum feature size.

4. The device of claim 1, wherein contact pads are arranged on one-side end portions of the line pattern set and the wide-width line pattern, in the first direction.

5. The device of claim 1, wherein auxiliary patterns are arranged apart from the line pattern set and from the wide-width line pattern by the first space, the auxiliary patterns being around the line pattern set and the wide-width line pattern in the first direction.

6. The device of claim 5, wherein the auxiliary patterns extend in the second direction and are spaced apart from edges of the line pattern set and the wide-width line pattern by the first space in the first direction, the auxiliary patterns being around the line pattern set and the wide-width line pattern in the first direction.

7. The device of claim 1, further comprising:

an interlayer insulating layer on a substrate;

a plurality of trenches in the interlayer insulating layer and arranged apart from one another by the first space; and the plurality of line patterns buried in the trenches, bottoms of all the plurality of line patterns being at a same height relative to an upper surface of the substrate.

8. The device of claim 7, wherein the trenches have the first width and the second width, the two sub-line patterns of the line pattern set are buried in trenches having the first width, and the wide-width line pattern is buried in a trench having the second width.

9. The device of claim 7, wherein the substrate includes a high-density region and a low-density region, and the line patterns are in the high-density region.

10. The device of claim 9, further comprising a wide-width line pattern in the low-density region, and the wide-width line pattern in the low-density region has a width greater than each of the two sub-line patterns.

11. The device of claim 1, wherein the line pattern set and the wide-width line pattern have longitudinal directions extending along the first direction, as viewed in the plan view, and the first and second widths being uniform in the first direction.

12. A semiconductor device, comprising:

a first line pattern set extending in a first direction and including two sub-line patterns that are arranged apart from each other by a first space in a second direction perpendicular to the first direction and each of the two sub-line patterns of the first line pattern set has a first width of a minimum feature size (1F) in the second direction;

a first wide-width line pattern extending parallel to the first line pattern set in the first direction, the first wide-width line pattern that is arranged apart from the first line pattern set by the first space in the second direction and has a second width greater than the first width in the second direction; and a second line pattern set extending parallel to the wide-width line pattern in a first direction, the second line pattern set that is arranged apart from the wide-width line pattern by the first space in the second direction and including two sub-line patterns that are arranged apart from each other by the first space in the second direction and each of the two sub-line patterns of the second line pattern set has the first width of a minimum feature size (1F) in the second direction, wherein the first and second line pattern sets and the first wide-width line pattern are conductive line patterns.

13. The device of claim 12, wherein the first space is determined by the minimum feature size, and the first space is greater than the minimum feature size and smaller than double (2F) the minimum feature size.

14. The device of claim 12, wherein the first line pattern set, the wide-width line pattern, and the second line pattern set are conductive line patterns.

15. The device of claim 12, wherein contact pads are further arranged in one-side end portions of the first line pattern set, the wide-width line pattern, and the second line pattern set in the first direction.

16. The device of claim 12, further comprising a second wide-width line pattern extending parallel to the second line pattern set in the first direction, the second wide-width line pattern that is arranged apart from the second line pattern set by the first space in the second direction and has the second width greater than the first width in the second direction.

17. A semiconductor device, comprising:

a first line pattern extending in a first direction and having a first width of the minimum feature size (1F) in a second direction perpendicular to the first direction;

a second line pattern extending parallel to the first line pattern in the first direction and being arranged apart from the first line pattern by a first space in the second direction and having the first width of the minimum feature size (1F) in the second direction;

a first wide-width line pattern extending parallel to the second line pattern in the first direction, the first wide-width line pattern that is arranged apart by the first space in the second direction and has a second width greater than the first width in the second direction;

a third line pattern extending parallel to the first wide-width line pattern in the first direction and being arranged apart from the first wide-width line pattern by the first space in the second direction and having the first width of the minimum feature size (1F) in the second direction; and a fourth line pattern extending parallel to the third line pattern in the first direction and being arranged apart from the third line pattern by the first space in the second direction and having the first width of the minimum feature size (1F) in the second direction, wherein the first space is determined by a distance between the first and second line patterns and the first space is greater than the minimum feature size and smaller than double the minimum feature size.

18. The device of claim 17, further comprising a second wide-width line pattern extending parallel to the fourth line pattern in the first direction, the second wide-width line pattern that is arranged apart from the fourth line pattern by the first space in the second direction and has the second width greater than the first width in the second direction.

* * * * *